United States Patent
Chen et al.

(10) Patent No.: US 8,969,169 B1
(45) Date of Patent: Mar. 3, 2015

(54) DRAM MIM CAPACITOR USING NON-NOBLE ELECTRODES

(71) Applicants: Intermolecular, Inc., San Jose, CA (US); Elpida Memory, Inc, Tokyo (JP)

(72) Inventors: Hanhong Chen, Milpitas, CA (US); David Chi, Los Altos, CA (US); Imran Hashim, Saratoga, CA (US); Mitsuhiro Horikawa, Higashihiroshima (JP); Sandra G. Malhotra, Fort Collins, CO (US)

(73) Assignee: Intermolecular, Inc., San Jose, CA (US)

( * ) Notice: Subject to any disclaimer, the term of this patent is extended or adjusted under 35 U.S.C. 154(b) by 6 days.

(21) Appl. No.: 14/033,326

(22) Filed: Sep. 20, 2013

(51) Int. Cl.
*H01L 21/00* (2006.01)
*H01L 49/02* (2006.01)

(52) U.S. Cl.
CPC ............. *H01L 28/40* (2013.01); *H01L 28/82* (2013.01)
USPC .......................................... 438/396; 257/532

(58) Field of Classification Search
None
See application file for complete search history.

(56) References Cited

U.S. PATENT DOCUMENTS

| | | | |
|---|---|---|---|
| 5,599,424 A * | 2/1997 | Matsumoto et al. | 438/738 |
| 7,875,525 B2 | 1/2011 | Lee et al. | |
| 8,318,572 B1 * | 11/2012 | Shanker et al. | 438/381 |
| 8,349,696 B1 | 1/2013 | Chen et al. | |
| 8,354,702 B1 * | 1/2013 | Shanker et al. | 257/296 |
| 8,415,657 B2 * | 4/2013 | Rui et al. | 257/15 |
| 8,481,384 B2 * | 7/2013 | Chen et al. | 438/240 |
| 8,530,348 B1 * | 9/2013 | Malhotra et al. | 438/624 |
| 8,541,283 B2 * | 9/2013 | Malhotra et al. | 438/396 |
| 8,546,236 B2 * | 10/2013 | Malhotra et al. | 438/396 |
| 8,581,318 B1 * | 11/2013 | Chen et al. | 257/306 |
| 8,674,479 B2 * | 3/2014 | Chen et al. | 257/532 |
| 8,741,712 B2 * | 6/2014 | Chiang et al. | 438/240 |
| 8,765,570 B2 * | 7/2014 | Malhotra et al. | 438/399 |
| 8,815,677 B2 * | 8/2014 | Chen et al. | 438/239 |
| 8,815,695 B2 * | 8/2014 | Rui et al. | 438/381 |
| 8,853,049 B2 * | 10/2014 | Deweerd et al. | 438/396 |
| 2002/0068465 A1 * | 6/2002 | Krasemann et al. | 438/763 |
| 2007/0001208 A1 | 1/2007 | Graham et al. | |
| 2011/0014359 A1 * | 1/2011 | Hashim et al. | 427/80 |
| 2012/0064690 A1 * | 3/2012 | Hirota et al. | 438/381 |
| 2012/0262835 A1 | 10/2012 | Ramani et al. | |
| 2012/0287553 A1 | 11/2012 | Ramani et al. | |
| 2012/0309160 A1 * | 12/2012 | Ramini et al. | 438/381 |
| 2012/0322221 A1 | 12/2012 | Chen et al. | |
| 2013/0052790 A1 * | 2/2013 | Deweerd et al. | 438/396 |
| 2013/0056851 A1 * | 3/2013 | Chen et al. | 257/532 |
| 2013/0095632 A1 * | 4/2013 | Rui et al. | 438/381 |
| 2013/0330902 A1 * | 12/2013 | Chen et al. | 438/396 |
| 2014/0077336 A1 * | 3/2014 | Chiang et al. | 257/532 |
| 2014/0080283 A1 * | 3/2014 | Song et al. | 438/396 |
| 2014/0183696 A1 * | 7/2014 | Rui et al. | 257/532 |
| 2014/0187016 A1 * | 7/2014 | Malhotra et al. | 438/381 |
| 2014/0269034 A1 * | 9/2014 | Manipatruni et al. | 365/158 |

* cited by examiner

*Primary Examiner* — Charles Garber
*Assistant Examiner* — Evren Seven

(57) ABSTRACT

A method for forming a capacitor stack includes forming a first bottom electrode layer including a conductive metal nitride material. A second bottom electrode layer is formed above the first bottom electrode layer. The second bottom electrode layer includes a conductive metal oxide material, wherein the crystal structure of the conductive metal oxide material promotes a desired high-k crystal phase of a subsequently deposited dielectric layer. A dielectric layer is formed above the second bottom electrode layer. Optionally, an oxygen-rich metal oxide layer is formed above the dielectric layer. Optionally, a third top electrode layer is formed above the oxygen-rich metal oxide layer. The third top electrode layer includes a conductive metal oxide material. A fourth top electrode layer is formed above the third top electrode layer. The fourth top electrode layer includes a conductive metal nitride material.

20 Claims, 11 Drawing Sheets

DRAM MIM CAPACITOR USING NON-NOBLE ELECTRODES

This document relates to the subject matter of a joint research agreement between Intermolecular, Inc. and Elpica Memory, Inc.

TECHNICAL FIELD

The present disclosure relates generally to the field of dynamic random access memory (DRAM), and more particularly to methods of forming a capacitor stack for improved DRAM performance.

BACKGROUND

Dynamic Random Access Memory utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d, and the relative dielectric constant or k-value of the dielectric material. The capacitance is given by:

$$C = \kappa \varepsilon_o \frac{A}{d} \quad \text{(Eqn. 1)}$$

where $\varepsilon_o$ represents the vacuum permittivity.

The dielectric constant is a measure of a material's polarizability. Therefore, the higher the dielectric constant of a material, the more electrical charge the capacitor can hold. Therefore, for a given desired capacitance, if the k-value of the dielectric is increased, the area of the capacitor can be decreased to maintain the same cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current density (generally <$10^{-7}$ A cm$^{-2}$). The physical thickness of the dielectric layers in DRAM capacitors cannot be reduced without limit because leakage current caused by tunneling mechanisms exponentially increases as the thickness of the dielectric layer decreases.

Traditionally, SiO$_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the SiO$_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. titanium nitride), or combinations thereof. MIM capacitors in these DRAM applications utilize insulating materials having a dielectric constant, or k-value, significantly higher than that of SiO$_2$ (k=3.9). For DRAM capacitors, the goal is to utilize dielectric materials with k-values greater than about 40. Such materials are generally classified as high-k materials. Representative examples of high-k materials for MIM capacitors are non-conducting metal oxides, non-conducting metal nitrides, non-conducting metal silicates or combinations thereof. These dielectric materials may also include additional dopant materials.

A figure of merit in DRAM technology is the electrical performance of the dielectric material as compared to SiO$_2$ known as the Equivalent Oxide Thickness (EOT). A high-k material's EOT is calculated using a normalized measure of silicon dioxide (SiO$_2$ k=3.9) as a reference, given by:

$$EOT = \frac{3.9}{\kappa} \cdot d \quad \text{(Eqn. 2)}$$

where d represents the physical thickness of the capacitor dielectric.

As DRAM technologies scale below the 40 nm technology node, manufacturers must reduce the EOT of the high-k dielectric films in MIM capacitors in order to increase charge storage capacity. The goal is to utilize dielectric materials that exhibit an EOT of less than about 0.8 nm while maintaining a physical thickness of about 5-20 nm.

There is a need to develop processes that allow the formation of a metal oxide-based electrode material that can serve as a template for the high-k phases of subsequently deposited dielectric layers, that contributes to lower leakage current, and has low resistivity, which contributes to higher device speed and lower power usage.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In some embodiments, a first bottom electrode layer includes a conductive metal nitride material. In some embodiments, the conductive metal nitride material includes one of titanium nitride, titanium aluminum nitride, titanium silicon nitride, tantalum nitride, tantalum aluminum nitride, or tantalum silicon nitride. In some embodiments, a second bottom electrode layer includes a conductive metal oxide material. In some embodiments, the conductive metal oxide material includes molybdenum oxide. In some embodiments, an oxygen-rich metal oxide layer is deposited above a dielectric layer. The oxygen-rich metal oxide layer can serve as a source of oxygen to ensure that the concentration of oxygen vacancies in the dielectric layer does not increase during subsequent heat treatments. In some embodiments, a third top electrode layer includes a conductive metal oxide material. In some embodiments, the conductive metal oxide material includes molybdenum oxide. In some embodiments, a fourth top electrode layer includes a conductive metal nitride material. In some embodiments, the conductive metal nitride material includes one of titanium nitride, titanium aluminum nitride, titanium silicon nitride, tantalum nitride, tantalum aluminum nitride, or tantalum silicon nitride.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1:
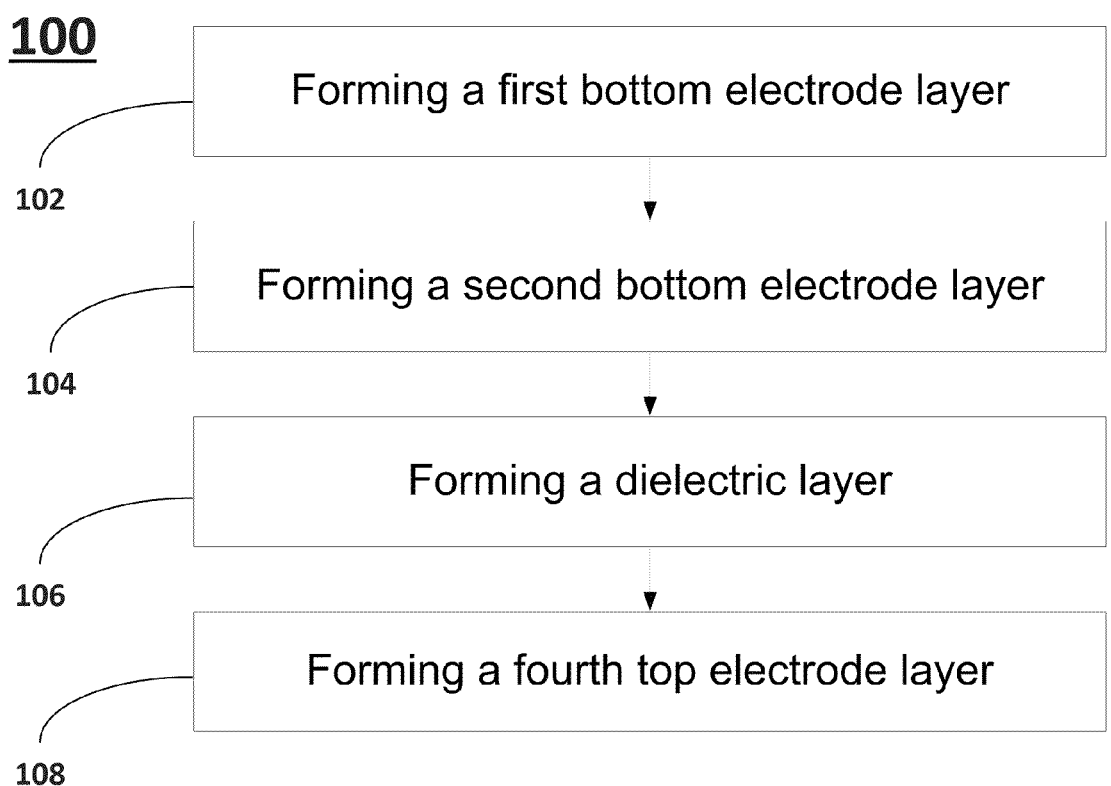
FIG. 1 illustrates a flow chart illustrating a method for fabricating a DRAM capacitor stack in accordance with some embodiments of the present invention.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

It must be noted that as used herein and in the claims, the singular forms "a," "an," and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. Where the modifier "about" or "approximately" is used, the stated quantity can vary by up to 10%. Where the modifier "substantially equal to" or "substantially the same" is used, the two quantities may vary from each other by no more than 5%.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

The discussion herein will use a simple capacitor stack as an illustration. The capacitor stack will include a first electrode layer (sometimes called a bottom electrode layer), a dielectric layer, and a second electrode layer (sometimes called a top electrode layer). Those skilled in the art will understand that each of the first electrode layer, dielectric layer, and second electrode layer may include multiple layers and multiple materials. In some embodiments, an additional layer will be inserted between the first electrode layer and the dielectric layer. As used herein, this layer will be labeled a "flash" layer. In some embodiments, an additional layer will be inserted between the dielectric layer and the second electrode layer. As used herein, this layer will be labeled a "capping" layer. The terms "first", "bottom", "second", "top", "flash", "capping", etc. are included for convenience and to assist in the description of the capacitor stack and are not meant to be limiting.

As used herein, a material (e.g. a dielectric material or an electrode material) will be considered to be "crystalline" if it exhibits greater than or equal to 30% crystallinity as measured by a technique such as x-ray diffraction (XRD).

As used herein, a "dopant" is a minor constituent of a layer or material that is purposely added. As used herein, the dopant may be electrically active or not electrically active. The definition excludes residues and impurities such as carbon, etc. that may be present in the material due to inefficiencies of the process or impurities in the precursor materials.

Those skilled in the art will appreciate that each of the layers discussed herein and used in the DRAM MIM capacitor may be formed using any common formation technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD). Generally, because of the complex morphology of the DRAM capacitor structure, ALD, PE-ALD, AVD, or CVD are preferred methods of formation. However, any of these techniques are suitable for forming each of the various layers discussed herein. Those skilled in the art will appreciate that the teachings described herein are not limited by the technology used for the deposition process.

In FIGS. 2, 4, 6, and 9-11, a capacitor stack is illustrated using a simple planar structure. Those skilled in the art will appreciate that the description and teachings herein can be readily applied to any simple or complex capacitor morphology. The drawings are for illustrative purposes only and do not limit the application of the present disclosure.

One class of high-k dielectric materials possessing the characteristics required for implementation in advanced DRAM capacitors includes high-k metal oxide materials. Titanium oxide and zirconium oxide are two metal oxide dielectric materials which display significant promise in terms of serving as high-k dielectric materials for implementation in DRAM capacitors. Other metal oxide high-k dielectric materials that have attracted attention include aluminum oxide, barium-strontium-titanate (BST), erbium oxide, hafnium oxide, hafnium silicate, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, etc.

The dielectric constant of a dielectric material may be dependent upon the crystalline phase(s) of the material. For example, in the case of titanium oxide (specifically $TiO_2$), the anatase crystalline phase of $TiO_2$ has a dielectric constant of approximately 40, while the rutile crystalline phase of $TiO_2$ can have a dielectric constant of approximately >80. Due to the higher k-value of the rutile-phase, it is desirable to produce $TiO_2$ based DRAM capacitors with the $TiO_2$ in the rutile-phase. The relative amounts of the anatase phase and the rutile phase can be determined from x-ray diffraction (XRD). From Eqn. 1 above, a $TiO_2$ material in the rutile-phase could be physically thicker and maintain the desired capacitance. The increased physical thickness is important for lowering the leakage current of the capacitor. The anatase phase will transition to the rutile phase at high temperatures (>8000). However, high temperature processes are undesirable in the manufacture of DRAM devices. Similarly, the cubic and tetragonal phases of $ZrO_2$ have a higher-k value than the monoclinic phase. So, it is desirable to produce $ZrO_2$ based DRAM capacitors with the $ZrO_2$ in the cubic or tetragonal phase.

The crystal phase of an adjacent material can be used to influence the growth of a specific crystal phase of a material if their crystal structures are similar and their lattice constants are similar. This technique is well known in technologies such as epitaxial growth. The same concepts have been extended to the growth of thin films where the adjacent material can be used as a "template" to encourage the growth of a desired crystalline phase over other competing crystal phases.

Generally, as the dielectric constant of a material increases, the band gap of the material decreases. This leads to high leakage current in the device. As a result, without the utilization of countervailing measures, capacitor stacks implementing high-k dielectric materials may experience large leakage currents. High work function electrodes (e.g., electrodes having a work function of greater than 5.0 eV) may be utilized in order to counter the effects of implementing a reduced band gap high-k dielectric material within the DRAM capacitor. Metals, such as platinum, gold, ruthenium, and ruthenium oxide are examples of high work function electrode materials suitable for inhibiting device leakage in a DRAM capacitor having a high-k dielectric material. The noble metal systems, however, are prohibitively expensive when employed in a mass production context. Moreover, electrodes fabricated from noble metals often suffer from poor manufacturing qualities, such as surface roughness and poor adhesion, and form a contamination risk in the fab.

Additionally, DRAM capacitor stacks may undergo various refinement process steps after fabrication. These refinement processes may include post-fabrication chemical and thermal processing (i.e., oxidation or reduction). For instance, after initial DRAM capacitor stack fabrication, a number of high temperature (up to about 60° C.) processes may be applied to complete the device fabrication. During these subsequent process steps, the DRAM capacitor materials must remain chemically, physically, and structurally stable. They must maintain the structural, compositional, physical, and electrical properties that have been developed. Furthermore, they should not undergo significant interaction or reaction which may degrade the performance of the DRAM capacitor.

Conductive metal oxides, conductive metal silicides, conductive metal carbides, conductive metal nitrides, or combinations thereof comprise other classes of materials that may be suitable as DRAM capacitor electrodes. Generally, transition metals and their conductive binary compounds form good candidates as electrode materials. The transition metals exist in several oxidation states. Therefore, a wide variety of compounds are possible. Conductive metal nitrides such as titanium nitride, tantalum nitride, tungsten nitride, etc. have attracted interest as DRAM capacitor electrodes with titanium nitride being the most popular. Different compounds may have different crystal structures, electrical properties, etc. It is important to utilize the proper compound for the desired application.

In one example, molybdenum has several binary oxides of which $MoO_2$ and $MoO_3$ are two examples. These two oxides of molybdenum have different properties. $MoO_2$ is conductive and has shown great promise as an electrode material in DRAM capacitors. $MoO_2$ has a distorted rutile crystal structure and can serve as an acceptable template to promote the deposition of the rutile-phase of titanium oxide as discussed above. $MoO_2$ also has a high work function (can be >5.0 eV depending on process history) which helps to minimize the leakage current of the DRAM device. However, oxygen-rich phases ($MoO_{2+x}$) of $MoO_2$ degrade the performance of the $MoO_2$ electrode material because they act more like insulators and have crystal structures that do not promote the formation of the rutile-phase of titanium oxide. For example, $MoO_3$ (the most oxygen-rich phase) is a dielectric material and has an orthorhombic crystal structure.

Generally, a deposited thin film may be amorphous, crystalline, or a mixture thereof. Furthermore, several different crystalline phases may exist. Therefore, processes (both deposition and post-treatment) must be developed to maximize the formation of crystalline $MoO_2$ and to minimize the presence of $MoO_{2+x}$ phases. Deposition processes and post-treatment processes in an inert or reducing atmosphere have been developed that allow crystalline $MoO_2$ to be used as the first electrode material (i.e. bottom electrode) in MIM DRAM capacitors with $TiO_2$ or doped-$TiO_2$ high-k dielectric materials. Examples of the post-treatment process are further described in U.S. application Ser. No. 13/084,666 filed on Apr. 12, 2011, entitled "METHOD FOR FABRICATING A DRAM CAPACITOR", (US Publication 2012/0262835), which is incorporated herein by reference for all purposes. Other conductive metal oxides that may be used as a template for the rutile phase of $TiO_2$ include the conductive compounds of chromium oxide, cobalt oxide, iridium oxide, manganese oxide, nickel oxide, ruthenium oxide, tin oxide, or tungsten oxide.

The use of $MoO_2$ as a first electrode material has a number of additional issues. Although the work function can be around 5.0 eV, this is not high enough to minimize the leakage current to meet the specifications of some advanced devices. Additionally, the resistivity of $MoO_2$ is high (~1000 μΩcm). This impacts the speed and power usage of the device.

FIG. 1 describes a method, 100, for fabricating a DRAM capacitor stack. The initial step, 102, includes forming a first bottom electrode layer above a substrate, wherein the first bottom electrode layer comprises a metal element. Examples of suitable electrode materials include metals, conductive metal oxides, conductive metal silicides, conductive metal nitrides, and combinations thereof. Two particularly interesting classes of materials are the conductive metal oxides and the conductive metal nitrides. The purpose of the first bottom electrode layer is to serve as a primary conductor. Examples of suitable materials for the first bottom electrode layer include titanium nitride, titanium aluminum nitride, titanium silicon nitride, tantalum nitride, tantalum aluminum nitride, and tantalum silicon nitride or combinations thereof.

The next step, 104, includes forming a second bottom electrode layer above the first bottom electrode layer, wherein the second bottom electrode layer comprises a metal element. Examples of suitable electrode materials include metals, conductive metal oxides, conductive metal silicides, conductive metal nitrides, and combinations thereof. Two particularly interesting classes of materials are the conductive metal oxides and the conductive metal nitrides. The purpose of the second bottom electrode layer is to promote a desired crystallographic structure and orientation of a subsequently deposited dielectric layer. As discussed previously, the k-value of a dielectric material may vary as a function of its crystallographic structure and orientation. Examples of suitable materials for the second bottom electrode layer include molybdenum oxide, chromium oxide, cobalt oxide, iridium oxide, manganese oxide, nickel oxide, ruthenium oxide, tin oxide, or tungsten oxide. The first bottom electrode layer and the second bottom electrode layer can then be subjected to an annealing process (not shown). The annealing step serves to crystallize the second bottom electrode layer.

The next step, 106, includes forming a dielectric layer above the second bottom electrode layer. Optionally, the dielectric layer can then be subjected to a post dielectric anneal (PDA) treatment (not shown). The PDA step serves to crystallize the dielectric material and fill oxygen vacancies.

The next step, 108, includes forming a fourth top electrode layer above the dielectric layer to form a capacitor stack, wherein the fourth top electrode layer comprises a metal element. Examples of suitable fourth top electrode materials include metals, conductive metal oxides, conductive metal silicides, conductive metal nitrides, and combinations thereof. Examples of suitable materials for the fourth top electrode layer include titanium nitride, titanium aluminum nitride, titanium silicon nitride, tantalum nitride, tantalum aluminum nitride, or tantalum silicon nitride, or combinations thereof. Optionally, the capacitor stack can then be subjected to a post metallization anneal (PMA) treatment process (not shown). In some embodiments, the PMA treatment is performed soon (i.e. before further processing steps) after the forming of the fourth top electrode layer. The PMA treatments are typically performed in an inert gas (e.g. nitrogen or argon) or in a dilute oxygen atmosphere (e.g. less than about 10% oxygen in nitrogen or argon). Preferably, the PMA treatments are performed in an inert gas. Examples of the PDA and PMA treatments are further described in U.S. patent application Ser. No. 13/159,842, filed on Jun. 14, 2011, (US Publication 2012/0322220), which is herein incorporated by reference for all purposes.

Figure 2:
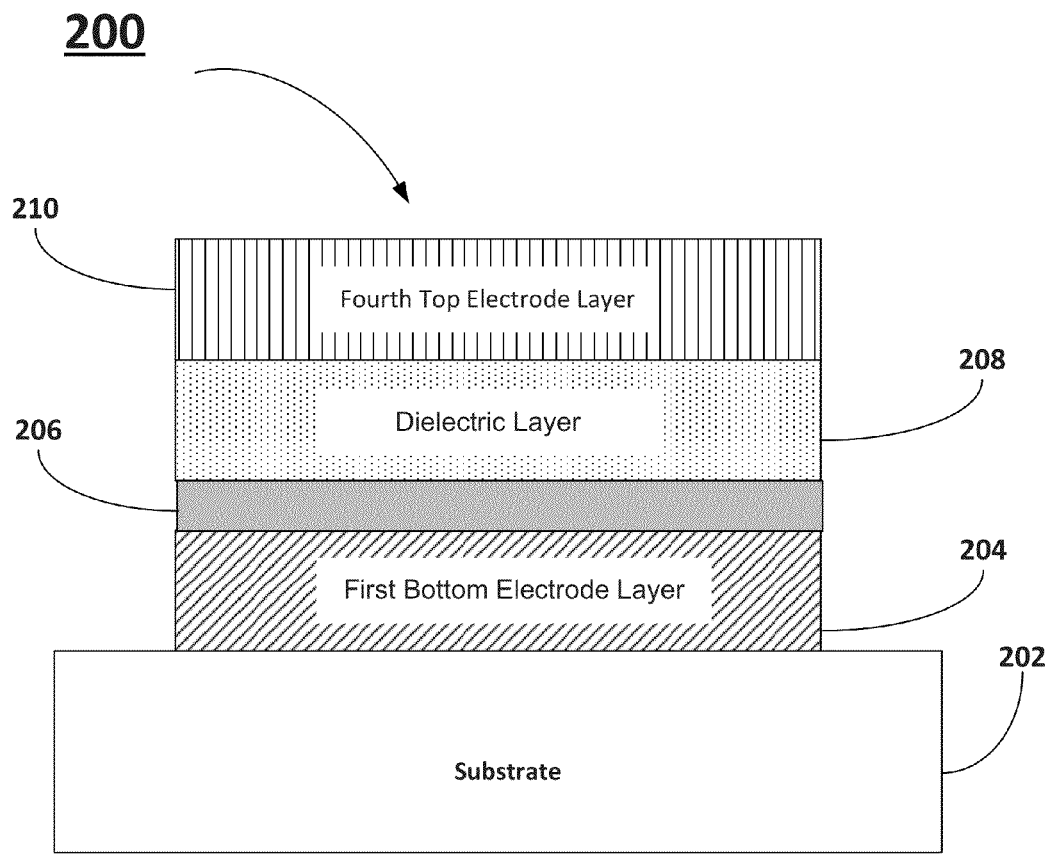
FIG. 2 illustrates a simplified cross-sectional view of a DRAM capacitor stack fabricated in accordance with some embodiments.

FIG. 2 illustrates a simple capacitor stack, 200, consistent with some embodiments. Using the method as outlined in FIG. 1 and described above, first bottom electrode layer, 204, is formed above substrate, 202. Generally, the substrate has already received several processing steps in the manufacture of a full DRAM device. First bottom electrode layer, 204, can include one of metals, conductive metal oxides, conductive metal nitrides, conductive metal silicides, and combinations thereof. In some embodiments, the first bottom electrode material is a conductive metal nitride. Examples of suitable conductive metal nitrides include titanium nitride, titanium aluminum nitride, titanium silicon nitride, tantalum nitride, tantalum aluminum nitride, or tantalum silicon nitride, nickel nitride, tungsten nitride, vanadium nitride, molybdenum nitride, and cobalt nitride, or combinations thereof.

In the next step, a second bottom electrode layer, 206, is formed above the first bottom electrode layer, wherein the second bottom electrode layer comprises a metal element. Examples of suitable electrode materials include metals, conductive metal oxides, conductive metal silicides, conductive metal nitrides, and combinations thereof. Two particularly interesting classes of materials are the conductive metal oxides and the conductive metal nitrides. Examples of suitable materials for the second bottom electrode layer include molybdenum oxide, chromium oxide, cobalt oxide, iridium oxide, manganese oxide, nickel oxide, ruthenium oxide, tin oxide, or tungsten oxide.

In the next step, dielectric layer, 208, would then be formed above the second bottom electrode layer, 206. A wide variety of dielectric materials have been targeted for use in DRAM capacitors. Examples of suitable dielectric materials include aluminum oxide, barium-strontium-titanate (BST), erbium oxide, hafnium oxide, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, or doped versions of the same. These dielectric materials may be formed as a single layer or may be formed as a hybrid or nanolaminate structure. In some embodiments, the dielectric material is titanium oxide. In some embodiments, the dielectric material is doped titanium oxide. Typical dopants for titanium oxide include Al, Ce, Co, Er, Ga, Gd, Ge, Hf, In, La, Lu, Mg, Mn, Nd, Pr, Sc, Si, Sn, Sr, Y, Zr, or combinations thereof.

In the next step, the fourth top electrode layer, 210, is formed above dielectric layer, 208, to form a capacitor stack. The fourth top electrode layer can include at least one of metals, conductive metal oxides, conductive metal nitrides, conductive metal silicides, conductive metal carbides, and combinations thereof. Examples of suitable conductive metal nitrides include titanium nitride, titanium aluminum nitride, titanium silicon nitride, tantalum nitride, tantalum aluminum nitride, or tantalum silicon nitride, nickel nitride, tungsten nitride, vanadium nitride, molybdenum nitride, and cobalt nitride, or combinations thereof. Typically, the capacitor stack would then be subjected to a PMA treatment. In some embodiments, the PMA treatment is performed soon (i.e. before further processing steps) after the forming of the fourth top electrode layer.

In some embodiments, a DRAM MIM capacitor stack includes a first bottom electrode layer including between about 5 nm and about 10 nm of a conductive metal nitride formed on a substrate. Examples of suitable conductive metal nitrides include titanium nitride, titanium aluminum nitride, titanium silicon nitride, tantalum nitride, tantalum aluminum nitride, or tantalum silicon nitride, nickel nitride, tungsten nitride, vanadium nitride, molybdenum nitride, and cobalt nitride, or combinations thereof. The conductive metal nitride first bottom electrode material is formed at a process temperature between about 150 C and 400 C using an ALD or CVD process technology. Optionally, the substrate with the first bottom electrode layer is then treated as discussed previously.

In some embodiments, a second bottom electrode layer including between about 5 nm and about 10 nm of molybdenum oxide is formed above the first bottom electrode layer. The molybdenum oxide second bottom electrode layer is formed at a process temperature between about 150 C and 400 C using an ALD process technology. Optionally, the substrate with the first bottom electrode layer and the second bottom electrode layer is then annealed in an inert (e.g. argon or nitrogen) or a reducing atmosphere for between about 1 millisecond and about 60 minutes. In some embodiments, the reducing atmosphere includes between about 1% and about 20% $H_2$ in $N_2$ and advantageously between about 5% and about 10% $H_2$ in $N_2$ between 400 and 520 C.

A dielectric layer would then be formed on the annealed second bottom electrode layer. A wide variety of dielectric materials have been targeted for use in DRAM capacitors. Examples of suitable dielectric materials include aluminum oxide, barium-strontium-titanate (BST), erbium oxide, hafnium oxide, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, or doped versions of the same. These dielectric materials may be formed as a single layer or may be formed as a hybrid or nanolaminate structure. Typical dopants for titanium oxide include Al, Ce, Co, Er, Ga, Gd, Ge, Hf, In, La, Lu, Mg, Mn, Nd, Pr, Sc, Si, Sn, Sr, Y, Zr, or combinations thereof. Typically, the dielectric layer is subjected to a PDA treatment before the formation of the fourth top electrode layer as discussed previously. A dielectric material of interest is titanium oxide doped with aluminum (e.g. as aluminum oxide) to between about 5 atomic % and about 15 atomic % Al as calculated by (Al/(Al+Ti)).

In a specific example, the dielectric layer comprises between about 6 nm to about 10 nm of $TiO_2$ wherein at least 30% of the $TiO_2$ is present in the rutile phase. Generally, the $TiO_2$ dielectric layer may either be a single film or may comprise a nanolaminate. Advantageously, the $TiO_2$ material is doped with Al at a concentration between about 5 atomic % and about 15 atomic % Al as calculated by (Al/(Al+Ti)). The $TiO_2$ dielectric layer is formed at a process temperature between about 200 C and 350 C using an ALD process technology. The substrate with the first electrode and dielectric layer is then annealed in an oxidizing atmosphere comprising between about 0% $O_2$ to about 100% $O_2$ in $N_2$ and advantageously between about 0% $O_2$ to about 20% $O_2$ in $N_2$ at temperatures between about 400 C to about 600 C for between about 1 millisecond to about 60 minutes.

In the next step, the fourth top electrode layer is formed above the dielectric layer to complete the formation of the capacitor stack. The fourth top electrode layer may include one of, metals, metal alloys, conductive metal oxides, conductive metal nitrides, conductive metal silicides, or combinations thereof, etc. In some embodiments, the fourth top electrode layer is a noble metal such as platinum or ruthenium. In some embodiments, the fourth top electrode layer is a conductive metal nitride. Examples of suitable conductive metal nitrides include titanium nitride, titanium aluminum nitride, titanium silicon nitride, tantalum nitride, tantalum aluminum nitride, or tantalum silicon nitride, nickel nitride, tungsten nitride, vanadium nitride, molybdenum nitride, and cobalt nitride, or combinations thereof. The capacitor stack may receive a PMA treatment as discussed previously. In some embodiments, the PMA treatment is performed soon (i.e. before further processing steps) after the forming of the fourth top electrode layer.

In some embodiments, the first bottom electrode layer includes titanium nitride and the second bottom electrode layer includes molybdenum oxide. Optionally, the first bottom electrode layer and the second bottom electrode layer are subjected to an annealing treatment before the deposition of a subsequent dielectric layer. In some embodiments, the dielectric layer includes doped titanium oxide. Optionally, the dielectric layer is subjected to an annealing treatment before the deposition of a subsequent fourth top electrode layer. In some embodiments, the fourth top electrode layer includes titanium nitride. Optionally, the capacitor stack may be subjected to a PMA treatment. In some embodiments, the PMA treatment is performed soon (i.e. before further processing steps) after the forming of the fourth top electrode layer.

In some embodiments, the first bottom electrode layer includes titanium aluminum nitride and the second bottom electrode layer includes molybdenum oxide. Optionally, the first bottom electrode layer and the second bottom electrode layer are subjected to an annealing treatment before the deposition of a subsequent dielectric layer. In some embodiments, the dielectric layer includes doped titanium oxide. Optionally, the dielectric layer is subjected to an annealing treatment before the deposition of a subsequent fourth top electrode layer. In some embodiments, the fourth top electrode layer includes titanium aluminum nitride. Optionally, the capacitor stack may be subjected to a PMA treatment. In some embodiments, the PMA treatment is performed soon (i.e. before further processing steps) after the forming of the fourth top electrode layer.

In some embodiments, the first bottom electrode layer includes titanium silicon nitride and the second bottom electrode layer includes molybdenum oxide. Optionally, the first bottom electrode layer and the second bottom electrode layer are subjected to an annealing treatment before the deposition of a subsequent dielectric layer. In some embodiments, the dielectric layer includes doped titanium oxide. Optionally, the dielectric layer is subjected to an annealing treatment before the deposition of a subsequent fourth top electrode layer. In some embodiments, the fourth top electrode layer includes titanium silicon nitride. Optionally, the capacitor stack may be subjected to a PMA treatment. In some embodiments, the PMA treatment is performed soon (i.e. before further processing steps) after the forming of the fourth top electrode layer.

In some embodiments, the first bottom electrode layer includes tantalum nitride and the second bottom electrode layer includes molybdenum oxide. Optionally, the first bottom electrode layer and the second bottom electrode layer are subjected to an annealing treatment before the deposition of a subsequent dielectric layer. In some embodiments, the dielectric layer includes doped titanium oxide. Optionally, the dielectric layer is subjected to an annealing treatment before the deposition of a subsequent fourth top electrode layer. In some embodiments, the fourth top electrode layer includes tantalum nitride. Optionally, the capacitor stack may be subjected to a PMA treatment. In some embodiments, the PMA treatment is performed soon (i.e. before further processing steps) after the forming of the fourth top electrode layer.

In some embodiments, the first bottom electrode layer includes tantalum aluminum nitride and the second bottom electrode layer includes molybdenum oxide. Optionally, the first bottom electrode layer and the second bottom electrode layer are subjected to an annealing treatment before the deposition of a subsequent dielectric layer. In some embodiments, the dielectric layer includes doped titanium oxide. Optionally, the dielectric layer is subjected to an annealing treatment before the deposition of a subsequent fourth top electrode layer. In some embodiments, the fourth top electrode layer includes tantalum aluminum nitride. Optionally, the capacitor stack may be subjected to a PMA treatment. In some embodiments, the PMA treatment is performed soon (i.e. before further processing steps) after the forming of the fourth top electrode layer.

In some embodiments, the first bottom electrode layer includes tantalum silicon nitride and the second bottom electrode layer includes molybdenum oxide. Optionally, the first bottom electrode layer and the second bottom electrode layer are subjected to an annealing treatment before the deposition of a subsequent dielectric layer. In some embodiments, the dielectric layer includes doped titanium oxide. Optionally, the dielectric layer is subjected to an annealing treatment before the deposition of a subsequent fourth top electrode layer. In some embodiments, the fourth top electrode layer includes tantalum silicon nitride. Optionally, the capacitor stack may be subjected to a PMA treatment. In some embodiments, the PMA treatment is performed soon (i.e. before further processing steps) after the forming of the fourth top electrode layer.

Figure 3:
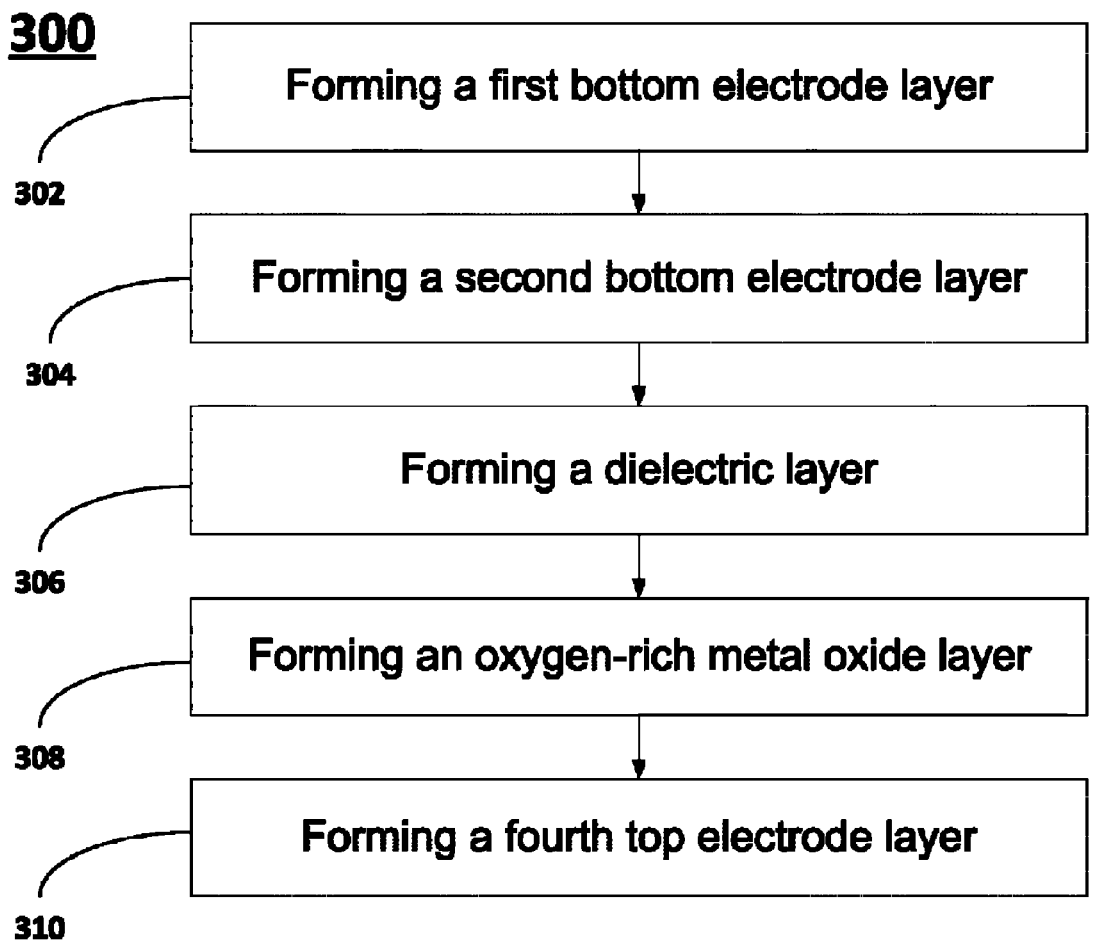
FIG. 3 illustrates a flow chart illustrating a method for fabricating a DRAM capacitor stack in accordance with some embodiments of the present invention.

FIG. 3 describes a method, 300, for fabricating a DRAM capacitor stack. The initial step, 302, includes forming a first bottom electrode layer above a substrate, wherein the first bottom electrode layer comprises a metal element. Examples of suitable electrode materials include metals, conductive metal oxides, conductive metal silicides, conductive metal nitrides, and combinations thereof. Two particularly interesting classes of materials are the conductive metal oxides and the conductive metal nitrides. The purpose of the first bottom electrode layer is to serve as a primary conductor. Examples of suitable materials for the first bottom electrode layer include titanium nitride, titanium aluminum nitride, titanium silicon nitride, tantalum nitride, tantalum aluminum nitride, or tantalum silicon nitride or combinations thereof.

The next step, 304, includes forming a second bottom electrode layer above the first bottom electrode layer, wherein the second bottom electrode layer comprises a metal element. Examples of suitable electrode materials include metals, conductive metal oxides, conductive metal silicides, conductive metal nitrides, and combinations thereof. Two particularly interesting classes of materials are the conductive metal oxides and the conductive metal nitrides. The purpose of the second bottom electrode layer is to promote a desired crystallographic orientation of a subsequently deposited dielectric layer. As discussed previously, the k-value of a dielectric material may vary as a function of its crystallographic orientation. Examples of suitable materials for the second bottom electrode layer include molybdenum oxide, chromium oxide, cobalt oxide, iridium oxide, manganese oxide, nickel oxide, ruthenium oxide, tin oxide, or tungsten oxide. The first bottom electrode layer and the second bottom electrode layer can then be subjected to an annealing process (not shown). The annealing step serves to crystallize the bottom electrode layers.

The next step, 306, includes forming a dielectric layer above the second bottom electrode layer. Optionally, the dielectric layer can then be subjected to a post dielectric anneal (PDA) treatment (not shown). The PDA step serves to crystallize the dielectric material and fill oxygen vacancies.

The next step, 308, includes forming an oxygen-rich metal oxide layer above the dielectric layer. As used herein, an oxygen-rich metal oxide layer will be understood to contain more oxygen than at least one of the stoichiometric metal oxide compounds of that metal. As an example, if the stoichiometric formula of a metal oxide is $MO_2$ (where M stands for the metal component), then an oxygen-rich compound would be given $MO_{(2+x)}$. Those skilled in the art will understand that the same metal may have additional metal oxide compounds such as $MO_3$. As used herein, the $MO_{(2+x)}$ layer would still be considered oxygen-rich since it has more oxygen than the $MO_2$ compound. The oxygen-rich metal oxide layer can serve as a source of oxygen to ensure that the concentration of oxygen vacancies in the dielectric layer does not increase during subsequent heat treatments. At least a portion of oxygen-rich metal layer is converted to a stoichiometric metal oxide compound by supplying oxygen to the dielectric layer during the heat treatment.

The next step, 310, includes forming a fourth top electrode layer above the oxygen-rich metal oxide layer to form a capacitor stack, wherein the fourth top electrode layer comprises a metal element. Examples of suitable fourth top electrode materials include metals, conductive metal oxides, conductive metal silicides, conductive metal nitrides, and combinations thereof. Examples of suitable conductive metal nitrides include titanium nitride, titanium aluminum nitride, titanium silicon nitride, tantalum nitride, tantalum aluminum nitride, or tantalum silicon nitride, nickel nitride, tungsten nitride, vanadium nitride, molybdenum nitride, and cobalt nitride, or combinations thereof. Optionally, the capacitor stack can then be subjected to PMA treatment process (not shown) as discussed previously. In some embodiments, the PMA treatment is performed soon (i.e. before further processing steps) after the forming of the fourth top electrode layer.

Figure 4:
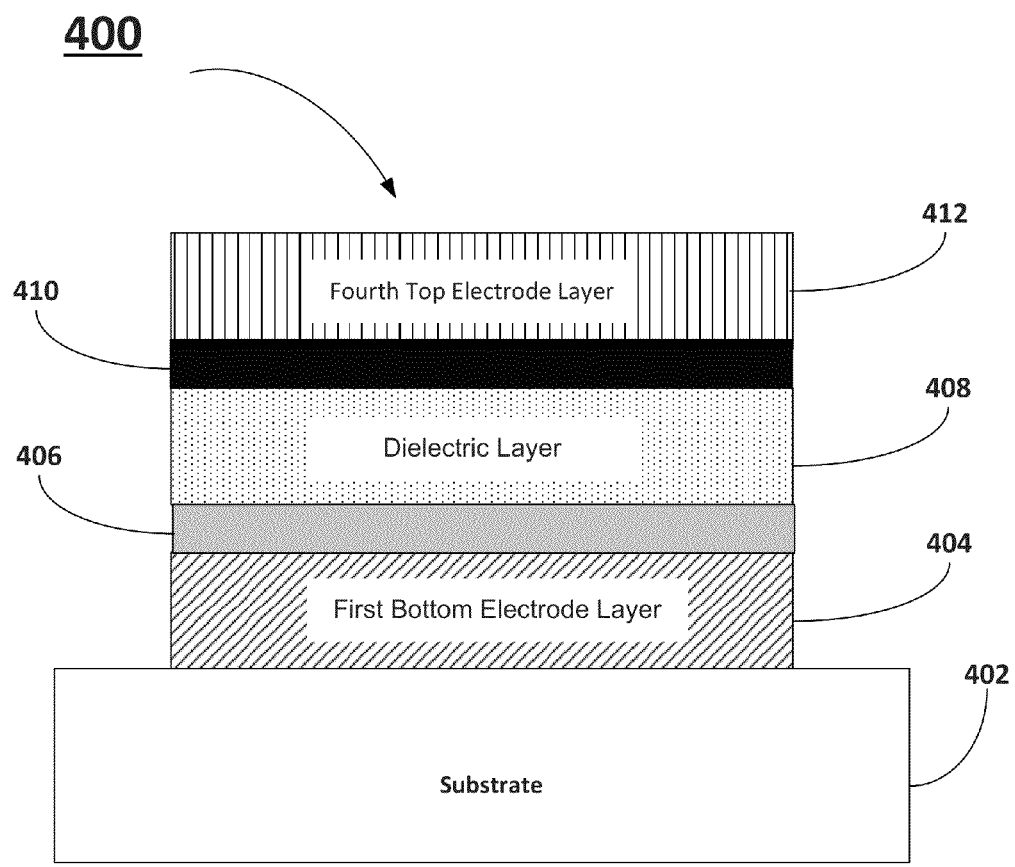
FIG. 4 illustrates a simplified cross-sectional view of a DRAM capacitor stack fabricated in accordance with some embodiments.

FIG. 4 illustrates a simple capacitor stack, 400, consistent with some embodiments. Using the method as outlined in FIG. 3 and described above, first bottom electrode layer, 404, is formed above substrate, 402. Generally, the substrate has already received several processing steps in the manufacture of a full DRAM device. First bottom electrode layer, 404, can include one of metals, conductive metal oxides, conductive metal nitrides, conductive metal silicides, and combinations thereof. In some embodiments, the first bottom electrode material is a conductive metal nitride. Examples of suitable conductive metal nitrides include titanium nitride, titanium aluminum nitride, titanium silicon nitride, tantalum nitride, tantalum aluminum nitride, or tantalum silicon nitride, nickel nitride, tungsten nitride, vanadium nitride, molybdenum nitride, and cobalt nitride, or combinations thereof.

In the next step, a second bottom electrode layer, 406, is formed above the first bottom electrode layer, wherein the second bottom electrode layer comprises a metal element. Examples of suitable electrode materials include metals, conductive metal oxides, conductive metal silicides, conductive metal nitrides, and combinations thereof. Two particularly interesting classes of materials are the conductive metal oxides and the conductive metal nitrides. Examples of suitable materials for the second bottom electrode layer include molybdenum oxide, chromium oxide, cobalt oxide, iridium oxide, manganese oxide, nickel oxide, ruthenium oxide, tin oxide, or tungsten oxide.

In the next step, dielectric layer, 408, would then be formed above the second bottom electrode layer, 406. A wide variety of dielectric materials have been targeted for use in DRAM capacitors. Examples of suitable dielectric materials include aluminum oxide, barium-strontium-titanate (BST), erbium oxide, hafnium oxide, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, or doped versions of the same. These dielectric materials may be formed as a single layer or may be formed as a hybrid or nanolaminate structure. In some embodiments, the dielectric material is titanium oxide. In some embodiments, the dielectric material is doped titanium oxide. Typical dopants for titanium oxide include Al, Ce, Co, Er, Ga, Gd, Ge, Hf, In, La, Lu, Mg, Mn, Nd, Pr, Sc, Si, Sn, Sr, Y, Zr, or combinations thereof.

In the next step, oxygen-rich metal oxide layer 410, would then be formed above the dielectric layer, 408.

In the next step, the fourth top electrode layer, 412, is formed above oxygen-rich metal oxide layer, 410, to form a capacitor stack. The fourth top electrode layer can include at least one of metals, conductive metal oxides, conductive metal nitrides, conductive metal silicides, conductive metal carbides, and combinations thereof. Examples of suitable conductive metal nitrides include titanium nitride, titanium aluminum nitride, titanium silicon nitride, tantalum nitride, tantalum aluminum nitride, or tantalum silicon nitride, nickel nitride, tungsten nitride, vanadium nitride, molybdenum nitride, and cobalt nitride, or combinations thereof. Typically, the capacitor stack would then be subjected to a PMA treatment. In some embodiments, the PMA treatment is performed soon (i.e. before further processing steps) after the forming of the fourth top electrode layer.

In some embodiments, a DRAM MIM capacitor stack includes a first bottom electrode layer including between about 5 nm and about 10 nm of a conductive metal nitride formed on a substrate. Examples of suitable conductive metal nitrides include titanium nitride, titanium aluminum nitride, titanium silicon nitride, tantalum nitride, tantalum aluminum nitride, or tantalum silicon nitride, nickel nitride, tungsten nitride, vanadium nitride, molybdenum nitride, and cobalt nitride, or combinations thereof. The conductive metal nitride first bottom electrode material is formed at a process temperature between about 150 C and 400 C using an ALD or CVD process technology. Optionally, the substrate with the first bottom electrode layer is then treated as discussed previously.

In some embodiments, a second bottom electrode layer including between about 5 nm and about 10 nm of molybdenum oxide is formed above the first bottom electrode layer. The molybdenum oxide second bottom electrode layer is formed at a process temperature between about 150 C and 400 C using an ALD process technology. The substrate with the first bottom electrode layer and the second bottom electrode layer is then annealed in an inert (e.g. argon or nitrogen) or a reducing atmosphere for between about 1 millisecond and about 60 minutes. In some embodiments, the reducing atmosphere includes between about 1% and about 20% $H_2$ in $N_2$ and advantageously between about 5% and about 10% $H_2$ in $N_2$ between 400 and 520 C.

A dielectric layer would then be formed on the annealed second bottom electrode layer. A wide variety of dielectric materials have been targeted for use in DRAM capacitors. Examples of suitable dielectric materials include aluminum oxide, barium-strontium-titanate (BST), erbium oxide, hafnium oxide, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, or doped versions of the same. These dielectric materials may be formed as a single layer or may be formed as a hybrid or nanolaminate structure. Typically, the dielectric layer is subjected to a PDA treatment before the formation of the fourth top electrode layer as discussed previously. A dielectric material of interest is titanium oxide doped with aluminum (e.g. as aluminum oxide) to between about 5 atomic % and about 15 atomic % Al as calculated by (Al/(Al+Ti)).

In a specific example, the dielectric layer comprises between about 6 nm to about 10 nm of $TiO_2$ wherein at least 30% of the $TiO_2$ is present in the rutile phase. Generally, the $TiO_2$ dielectric layer may either be a single film or may comprise a nanolaminate. Advantageously, the $TiO_2$ material is doped with Al at a concentration between about 5 atomic % and about 15 atomic % Al as calculated by (Al/(Al+Ti)). The $TiO_2$ dielectric layer is formed at a process temperature between about 200 C and 350 C using an ALD process technology. The substrate with the first electrode and dielectric layer is then annealed in an oxidizing atmosphere comprising between about 0% $O_2$ to about 100% $O_2$ in $N_2$ and advantageously between about 0% $O_2$ to about 20% $O_2$ in $N_2$ at temperatures between about 400 C to about 600 C for between about 1 millisecond to about 60 minutes.

In the next step, an oxygen-rich metal oxide layer including between about 0.5 nm and about 2.0 nm of molybdenum oxide is formed above the dielectric layer. The molybdenum oxide oxygen-rich metal oxide layer is formed at a process temperature between about 150 C and 400 C using an ALD process technology. The molybdenum oxide oxygen-rich metal oxide layer may be formed by extending the ozone step time longer than the molybdenum precursor step time during the ALD deposition process. The molybdenum oxide oxygen-rich metal oxide layer can have a general formula of $MoO_{(2+x)}$.

In the next step, the fourth top electrode layer is formed above the molybdenum oxide oxygen-rich metal oxide layer to complete the formation of the capacitor stack. The fourth top electrode layer may include one of metals, metal alloys, conductive metal oxides, conductive metal nitrides, conductive metal silicides, or combinations thereof, etc. In some embodiments, the fourth top electrode layer is a noble metal such as platinum or ruthenium. In some embodiments, the fourth top electrode layer is a conductive metal nitride. Examples of suitable materials for the fourth top electrode layer include titanium nitride, titanium aluminum nitride, titanium silicon nitride, tantalum nitride, tantalum aluminum nitride, or tantalum silicon nitride. Examples of suitable conductive metal nitrides include titanium nitride, titanium aluminum nitride, titanium silicon nitride, tantalum nitride, tantalum aluminum nitride, or tantalum silicon nitride, nickel nitride, tungsten nitride, vanadium nitride, molybdenum nitride, and cobalt nitride, or combinations thereof. The capacitor stack may receive a PMA treatment as discussed previously. In some embodiments, the PMA treatment is performed soon (i.e. before further processing steps) after the forming of the fourth top electrode layer.

In some embodiments, the first bottom electrode layer includes titanium nitride and the second bottom electrode layer includes molybdenum oxide. Optionally, the first bottom electrode layer and the second bottom electrode layer are subjected to an annealing treatment before the deposition of a subsequent dielectric layer. In some embodiments, the dielectric layer includes doped titanium oxide. Optionally, the dielectric layer is subjected to an annealing treatment before the deposition of a subsequent oxygen-rich metal oxide layer. In some embodiments, the oxygen-rich metal oxide layer includes molybdenum oxide. In some embodiments, the fourth top electrode layer includes titanium nitride. Optionally, the capacitor stack may be subjected to a PMA treatment. In some embodiments, the PMA treatment is performed soon (i.e. before further processing steps) after the forming of the fourth top electrode layer.

In some embodiments, the first bottom electrode layer includes titanium aluminum nitride and the second bottom electrode layer includes molybdenum oxide. Optionally, the first bottom electrode layer and the second bottom electrode layer are subjected to an annealing treatment before the deposition of a subsequent dielectric layer. In some embodiments, the dielectric layer includes doped titanium oxide. Optionally, the dielectric layer is subjected to an annealing treatment before the deposition of a subsequent oxygen-rich metal oxide layer. In some embodiments, the oxygen-rich metal oxide layer includes molybdenum oxide. In some embodiments, the fourth top electrode layer includes titanium aluminum nitride. Optionally, the capacitor stack may be subjected to a PMA treatment. In some embodiments, the PMA treatment is performed soon (i.e. before further processing steps) after the forming of the fourth top electrode layer.

In some embodiments, the first bottom electrode layer includes titanium silicon nitride and the second bottom electrode layer includes molybdenum oxide. Optionally, the first bottom electrode layer and the second bottom electrode layer are subjected to an annealing treatment before the deposition of a subsequent dielectric layer. In some embodiments, the dielectric layer includes doped titanium oxide. Optionally, the dielectric layer is subjected to an annealing treatment before the deposition of a subsequent oxygen-rich metal oxide layer. In some embodiments, the oxygen-rich metal oxide layer includes molybdenum oxide. In some embodiments, the fourth top electrode layer includes titanium silicon nitride. Optionally, the capacitor stack may be subjected to a PMA treatment. In some embodiments, the PMA treatment is performed soon (i.e. before further processing steps) after the forming of the fourth top electrode layer.

In some embodiments, the first bottom electrode layer includes tantalum nitride and the second bottom electrode layer includes molybdenum oxide. Optionally, the first bottom electrode layer and the second bottom electrode layer are subjected to an annealing treatment before the deposition of a subsequent dielectric layer. In some embodiments, the dielectric layer includes doped titanium oxide. Optionally, the dielectric layer is subjected to an annealing treatment before the deposition of a subsequent oxygen-rich metal oxide layer. In some embodiments, the oxygen-rich metal oxide layer includes molybdenum oxide. In some embodiments, the fourth top electrode layer includes tantalum nitride. Optionally, the capacitor stack may be subjected to a PMA treatment. In some embodiments, the PMA treatment is performed soon (i.e. before further processing steps) after the forming of the fourth top electrode layer.

In some embodiments, the first bottom electrode layer includes tantalum aluminum nitride and the second bottom electrode layer includes molybdenum oxide. Optionally, the first bottom electrode layer and the second bottom electrode layer are subjected to an annealing treatment before the deposition of a subsequent dielectric layer. In some embodiments, the dielectric layer includes doped titanium oxide. Optionally, the dielectric layer is subjected to an annealing treatment before the deposition of a subsequent oxygen-rich metal oxide layer. In some embodiments, the oxygen-rich metal oxide layer includes molybdenum oxide. In some embodiments, the fourth top electrode layer includes tantalum aluminum nitride. Optionally, the capacitor stack may be subjected to a PMA treatment. In some embodiments, the PMA treatment is performed soon (i.e. before further processing steps) after the forming of the fourth top electrode layer.

In some embodiments, the first bottom electrode layer includes tantalum silicon nitride and the second bottom electrode layer includes molybdenum oxide. Optionally, the first bottom electrode layer and the second bottom electrode layer are subjected to an annealing treatment before the deposition of a subsequent dielectric layer. In some embodiments, the dielectric layer includes doped titanium oxide. Optionally, the dielectric layer is subjected to an annealing treatment before the deposition of a subsequent oxygen-rich metal oxide layer. In some embodiments, the oxygen-rich metal oxide layer includes molybdenum oxide. In some embodiments, the fourth top electrode layer includes tantalum silicon nitride. Optionally, the capacitor stack may be subjected to a PMA treatment. In some embodiments, the PMA treatment is performed soon (i.e. before further processing steps) after the forming of the fourth top electrode layer.

Figure 5:
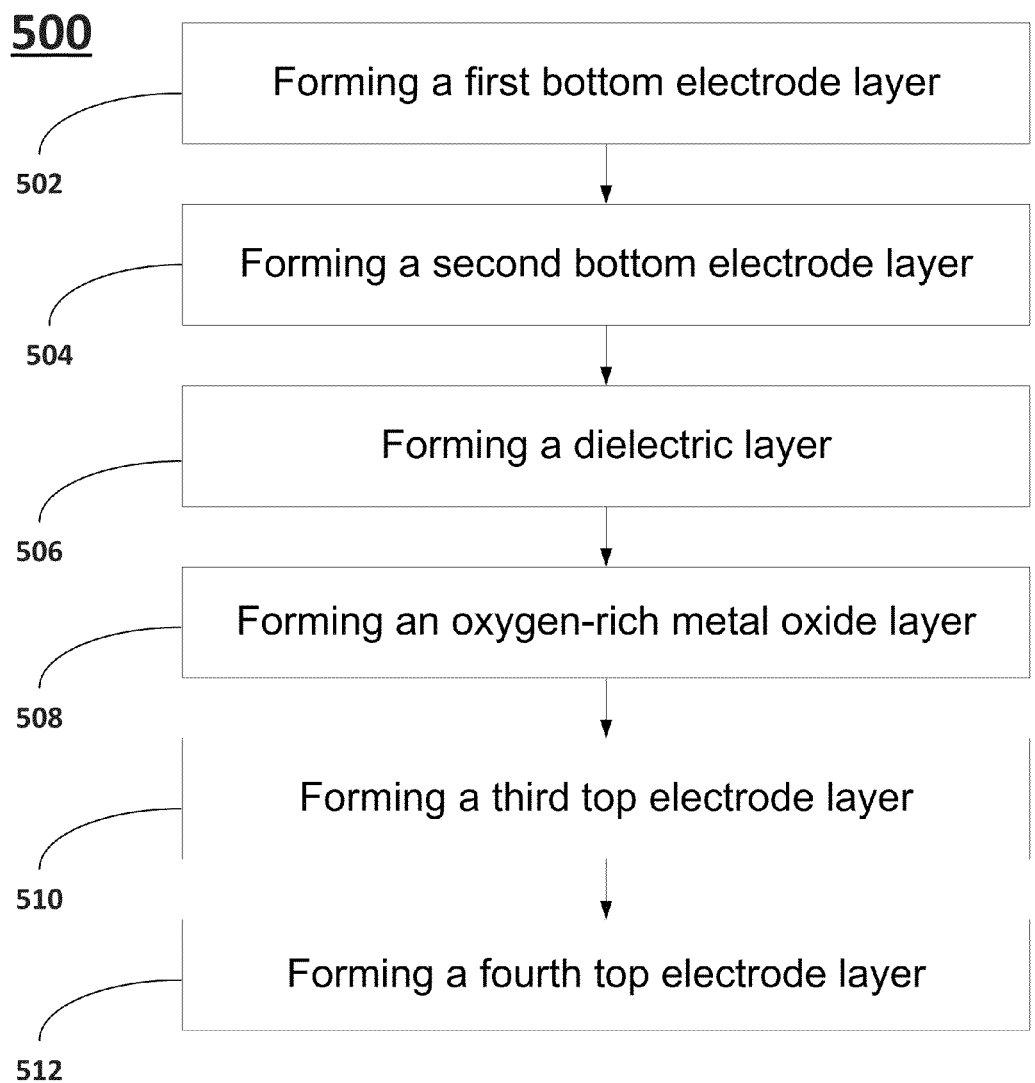
FIG. 5 illustrates a flow chart illustrating a method for fabricating a DRAM capacitor stack in accordance with some embodiments of the present invention.

FIG. 5 describes a method, 500, for fabricating a DRAM capacitor stack. The initial step, 502, includes forming a first bottom electrode layer above a substrate, wherein the first bottom electrode layer comprises a metal element. Examples of suitable electrode materials include metals, conductive metal oxides, conductive metal silicides, conductive metal nitrides, and combinations thereof. Two particularly interesting classes of materials are the conductive metal oxides and the conductive metal nitrides. The purpose of the first bottom electrode layer is to serve as a primary conductor. Examples of suitable materials for the first bottom electrode layer include titanium nitride, titanium aluminum nitride, titanium silicon nitride, tantalum nitride, tantalum aluminum nitride, or tantalum silicon nitride.

The next step, 504, includes forming a second bottom electrode layer above the first bottom electrode layer, wherein the second bottom electrode layer comprises a metal element. Examples of suitable electrode materials include metals, conductive metal oxides, conductive metal silicides, conductive metal nitrides, and combinations thereof. Two particularly interesting classes of materials are the conductive metal oxides and the conductive metal nitrides. The purpose of the second bottom electrode layer is to promote a desired crystallographic orientation of a subsequently deposited dielectric layer. As discussed previously, the k-value of a dielectric material may vary as a function of its crystallographic orientation. Examples of suitable materials for the second bottom electrode layer include molybdenum oxide, chromium oxide, cobalt oxide, iridium oxide, manganese oxide, nickel oxide, ruthenium oxide, tin oxide, or tungsten oxide. The first bottom electrode layer and the second bottom electrode layer can then be subjected to an annealing process (not shown). The annealing step serves to crystallize the bottom electrode layers.

The next step, 506, includes forming a dielectric layer above the second bottom electrode layer. Optionally, the dielectric layer can then be subjected to a post dielectric anneal (PDA) treatment (not shown). The PDA step serves to crystallize the dielectric material and fill oxygen vacancies.

The next step, 508, includes forming an oxygen-rich metal oxide layer above the dielectric layer. The oxygen-rich metal oxide layer can serve as a source of oxygen to ensure that the concentration of oxygen vacancies in the dielectric layer does not increase during subsequent heat treatments.

The next step, 510, includes forming a third top electrode layer above the dielectric layer, wherein the third top electrode layer comprises a metal element. Examples of suitable electrode materials include metals, conductive metal oxides, conductive metal silicides, conductive metal nitrides, and combinations thereof. Two particularly interesting classes of materials are the conductive metal oxides and the conductive metal nitrides. The purpose of the third top electrode layer is to promote a desired crystallographic orientation of a previously deposited dielectric layer. As discussed previously, the k-value of a dielectric material may vary as a function of its crystallographic orientation. Examples of suitable materials for the third top electrode layer include molybdenum oxide, chromium oxide, cobalt oxide, iridium oxide, manganese oxide, nickel oxide, ruthenium oxide, tin oxide, or tungsten oxide.

The next step, 512, includes forming a fourth top electrode layer above the third top electrode layer to form a capacitor stack, wherein the fourth top electrode layer comprises a metal element. Examples of suitable fourth top electrode materials include metals, conductive metal oxides, conductive metal silicides, conductive metal nitrides, and combinations thereof. Examples of suitable materials for the fourth top electrode layer include titanium nitride, titanium aluminum nitride, titanium silicon nitride, tantalum nitride, tantalum aluminum nitride, or tantalum silicon nitride, or combinations thereof. Optionally, the capacitor stack can then be subjected to PMA treatment process (not shown) as discussed previously. In some embodiments, the PMA treatment is performed soon (i.e. before further processing steps) after the forming of the fourth top electrode layer.

Figure 6:
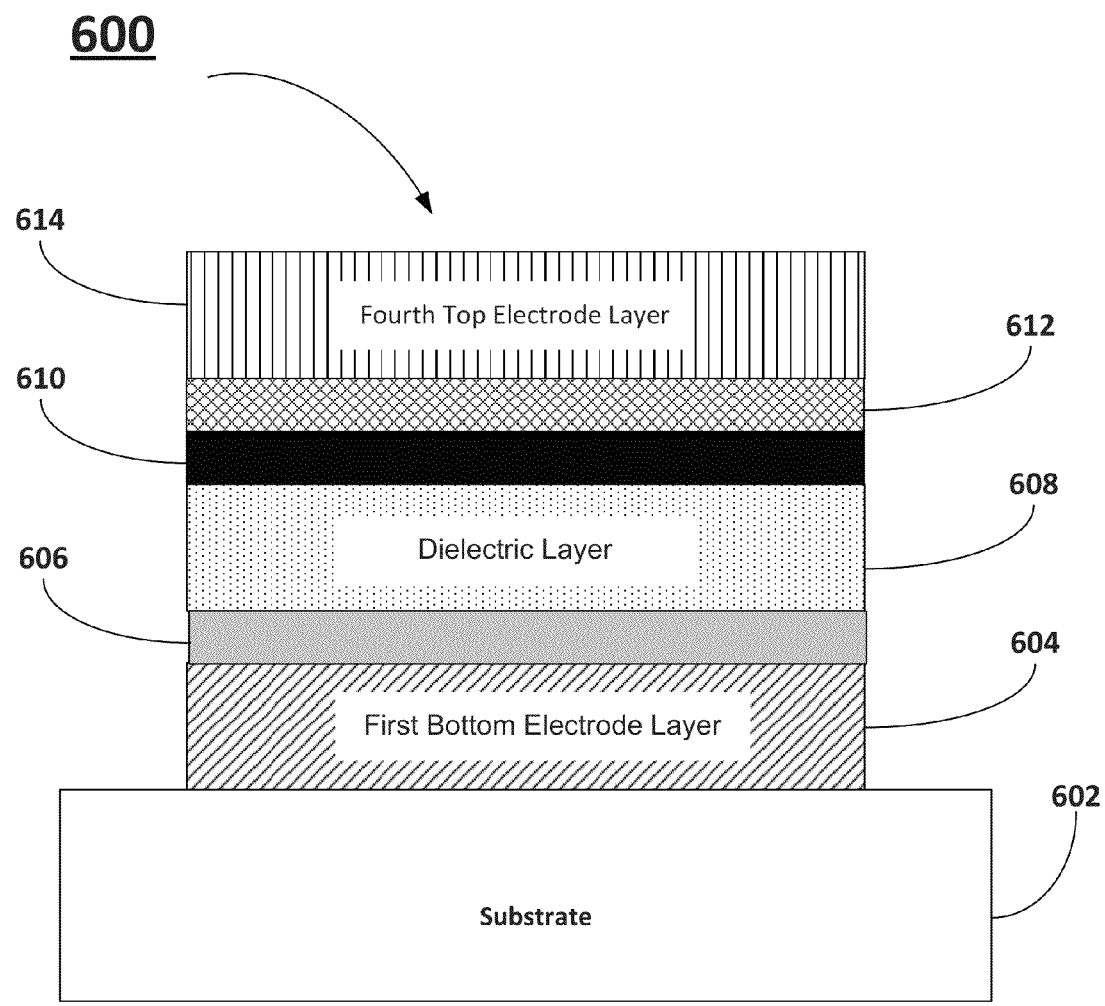
FIG. 6 illustrates a simplified cross-sectional view of a DRAM capacitor stack fabricated in accordance with some embodiments.

FIG. 6 illustrates a simple capacitor stack, 600, consistent with some embodiments. Using the method as outlined in FIG. 5 and described above, first bottom electrode layer, 604, is formed above substrate, 602. Generally, the substrate has already received several processing steps in the manufacture of a full DRAM device. First bottom electrode layer, 604, can include one of metals, conductive metal oxides, conductive metal nitrides, conductive metal silicides, and combinations thereof. In some embodiments, the first bottom electrode material is a conductive metal nitride. Examples of suitable conductive metal nitrides include titanium nitride, titanium aluminum nitride, titanium silicon nitride, tantalum nitride, tantalum aluminum nitride, or tantalum silicon nitride, nickel nitride, tungsten nitride, vanadium nitride, molybdenum nitride, and cobalt nitride, or combinations thereof.

In the next step, a second bottom electrode layer, 606, is formed above the first bottom electrode layer, wherein the second bottom electrode layer comprises a metal element. Examples of suitable electrode materials include metals, conductive metal oxides, conductive metal silicides, conductive metal nitrides, and combinations thereof. Two particularly interesting classes of materials are the conductive metal oxides and the conductive metal nitrides. Examples of suitable materials for the second bottom electrode layer include molybdenum oxide, chromium oxide, cobalt oxide, iridium oxide, manganese oxide, nickel oxide, ruthenium oxide, tin oxide, or tungsten oxide.

In the next step, dielectric layer, 608, would then be formed above the second bottom electrode layer, 606. A wide variety of dielectric materials have been targeted for use in DRAM capacitors. Examples of suitable dielectric materials include aluminum oxide, barium-strontium-titanate (BST), erbium oxide, hafnium oxide, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, or doped versions of the same. These dielectric materials may be formed as a single layer or may be formed as a hybrid or nanolaminate structure. In some embodiments, the dielectric material is titanium oxide. In some embodiments, the dielectric material is doped titanium oxide. Typical dopants for titanium oxide include Al, Ce, Co, Er, Ga, Gd, Ge, Hf, In, La, Lu, Mg, Mn, Nd, Pr, Sc, Si, Sn, Sr, Y, Zr, or combinations thereof.

In the next step, oxygen-rich metal oxide layer 610, would then be formed above the dielectric layer, 608.

In the next step, third top electrode layer 612, would then be formed above the oxygen-rich metal oxide layer, 610, wherein the third top electrode layer comprises a metal element. Examples of suitable electrode materials include metals, conductive metal oxides, conductive metal silicides, conductive metal nitrides, and combinations thereof. Two particularly interesting classes of materials are the conductive metal oxides and the conductive metal nitrides. Examples of suitable materials for the third top electrode layer include molybdenum oxide, chromium oxide, cobalt oxide, iridium oxide, manganese oxide, nickel oxide, ruthenium oxide, tin oxide, or tungsten oxide.

In the next step, the fourth top electrode layer, 614, is formed above third top electrode layer, 612, to form a capacitor stack. The fourth top electrode layer can include at least one of metals, conductive metal oxides, conductive metal nitrides, conductive metal silicides, conductive metal carbides, and combinations thereof. Examples of suitable materials for the fourth top electrode layer include titanium nitride, titanium aluminum nitride, titanium silicon nitride, tantalum nitride, tantalum aluminum nitride, or tantalum silicon nitride, or combinations thereof. Typically, the capacitor stack would then be subjected to a PMA treatment. In some embodiments, the PMA treatment is performed soon (i.e. before further processing steps) after the forming of the fourth top electrode layer.

In some embodiments, a DRAM MIM capacitor stack includes a first bottom electrode layer including between about 5 nm and about 10 nm of a conductive metal nitride formed on a substrate. Examples of suitable conductive metal nitrides include titanium nitride, titanium aluminum nitride, titanium silicon nitride, tantalum nitride, tantalum aluminum nitride, or tantalum silicon nitride, nickel nitride, tungsten nitride, vanadium nitride, molybdenum nitride, and cobalt nitride, or combinations thereof. The conductive metal nitride first bottom electrode material is formed at a process temperature between about 150 C and 400 C using an ALD or CVD process technology. Optionally, the substrate with the first bottom electrode layer is then treated as discussed previously.

In some embodiments, a second bottom electrode layer including between about 5 nm and about 10 nm of molybdenum oxide is formed above the first bottom electrode layer. The molybdenum oxide second bottom electrode layer is formed at a process temperature between about 150 C and 400 C using an ALD process technology. Optionally, the substrate with the first bottom electrode layer and the second bottom electrode layer is then annealed in an inert (e.g. argon or nitrogen) or a reducing atmosphere for between about 1 millisecond and about 60 minutes. In some embodiments, the reducing atmosphere includes between about 1% and about 20% $H_2$ in $N_2$ and advantageously between about 5% and about 10% $H_2$ in $N_2$ between 400 and 520 C.

A dielectric layer would then be formed on the annealed second bottom electrode layer. A wide variety of dielectric materials have been targeted for use in DRAM capacitors. Examples of suitable dielectric materials include aluminum oxide, barium-strontium-titanate (BST), erbium oxide, hafnium oxide, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, or doped versions of the same. These dielectric materials may be formed as a single layer or may be formed as a hybrid or nanolaminate structure. Typically, the dielectric layer is subjected to a PDA treatment before the formation of the fourth top electrode layer as discussed previously. A dielectric material of interest is titanium oxide doped with aluminum (e.g. as aluminum oxide) to between about 5 atomic % and about 15 atomic % Al as calculated by (Al/(Al+Ti)).

In a specific example, the dielectric layer comprises between about 6 nm to about 10 nm of $TiO_2$ wherein at least 30% of the $TiO_2$ is present in the rutile phase. Generally, the $TiO_2$ dielectric layer may either be a single film or may comprise a nanolaminate. Advantageously, the $TiO_2$ material is doped with Al at a concentration between about 5 atomic % and about 15 atomic % Al as calculated by (Al/(Al+Ti)). The $TiO_2$ dielectric layer is formed at a process temperature between about 200 C and 350 C using an ALD process technology. The substrate with the first electrode and dielectric layer is then annealed in an oxidizing atmosphere comprising between about 0% $O_2$ to about 100% $O_2$ in $N_2$ and advantageously between about 0% $O_2$ to about 20% $O_2$ in $N_2$ at temperatures between about 400 C to about 600 C for between about 1 millisecond to about 60 minutes.

In the next step, an oxygen-rich metal oxide layer including between about 0.1 nm and about 5.0 nm of molybdenum oxide is formed above the dielectric layer. In some embodiments, the oxygen-rich metal oxide layer includes between about 0.1 nm and 2.0 nm of molybdenum oxide. The oxygen-rich metal oxide layer (e.g. molybdenum oxide) is formed at a process temperature between about 150 C and 400 C using an ALD process technology. The molybdenum oxide oxygen-rich metal oxide layer can have a general formula of $Mo_{(2+x)}$.

In some embodiments, a third top electrode layer including between about 2 nm and about 10 nm of molybdenum oxide is formed above the oxygen-rich metal oxide layer. The molybdenum oxide third top electrode layer is formed at a process temperature between about 150 C and 400 C using an ALD process technology.

In the next step, the fourth top electrode layer is formed above the third top electrode layer to complete the formation of the capacitor stack. The fourth top electrode layer may include one of metals, metal alloys, conductive metal oxides, conductive metal nitrides, conductive metal silicides, or combinations thereof, etc. In some embodiments, the fourth top electrode layer is a noble metal such as platinum or ruthenium. In some embodiments, the fourth top electrode layer is a conductive metal nitride. Examples of suitable conductive metal nitrides include titanium nitride, titanium aluminum nitride, titanium silicon nitride, tantalum nitride, tantalum aluminum nitride, or tantalum silicon nitride, nickel nitride, tungsten nitride, vanadium nitride, molybdenum nitride, and cobalt nitride, or combinations thereof. The capacitor stack may receive a PMA treatment as discussed previously. In some embodiments, the PMA treatment is performed soon (i.e. before further processing steps) after the forming of the fourth top electrode layer.

In some embodiments, the first bottom electrode layer includes titanium nitride and the second bottom electrode layer includes molybdenum oxide. Optionally, the first bottom electrode layer and the second bottom electrode layer are subjected to an annealing treatment before the deposition of a subsequent dielectric layer. In some embodiments, the dielectric layer includes doped titanium oxide. Optionally, the dielectric layer is subjected to an annealing treatment before the deposition of a subsequent oxygen-rich metal oxide layer. In some embodiments, the oxygen-rich metal oxide layer includes molybdenum oxide. In some embodiments, the third top electrode layer includes molybdenum oxide. In some embodiments, the fourth top electrode layer includes titanium nitride. Optionally, the capacitor stack may be subjected to a PMA treatment. In some embodiments, the PMA treatment is performed soon (i.e. before further processing steps) after the forming of the fourth top electrode layer.

In some embodiments, the first bottom electrode layer includes titanium aluminum nitride and the second bottom electrode layer includes molybdenum oxide. Optionally, the first bottom electrode layer and the second bottom electrode layer are subjected to an annealing treatment before the deposition of a subsequent dielectric layer. In some embodiments, the dielectric layer includes doped titanium oxide. Optionally, the dielectric layer is subjected to an annealing treatment before the deposition of a subsequent oxygen-rich metal oxide layer. In some embodiments, the oxygen-rich metal oxide layer includes molybdenum oxide. In some embodiments, the third top electrode layer includes molybdenum oxide. In some embodiments, the fourth top electrode layer includes titanium aluminum nitride. Optionally, the capacitor stack may be subjected to a PMA treatment. In some embodiments, the PMA treatment is performed soon (i.e. before further processing steps) after the forming of the fourth top electrode layer.

In some embodiments, the first bottom electrode layer includes titanium silicon nitride and the second bottom electrode layer includes molybdenum oxide. Optionally, the first bottom electrode layer and the second bottom electrode layer are subjected to an annealing treatment before the deposition of a subsequent dielectric layer. In some embodiments, the dielectric layer includes doped titanium oxide. Optionally, the dielectric layer is subjected to an annealing treatment before the deposition of a subsequent oxygen-rich metal oxide layer. In some embodiments, the oxygen-rich metal oxide layer includes molybdenum oxide. In some embodiments, the third top electrode layer includes molybdenum oxide. In some embodiments, the fourth top electrode layer includes titanium silicon nitride. Optionally, the capacitor stack may be subjected to a PMA treatment. In some embodiments, the PMA treatment is performed soon (i.e. before further processing steps) after the forming of the fourth top electrode layer.

In some embodiments, the first bottom electrode layer includes tantalum nitride and the second bottom electrode layer includes molybdenum oxide. Optionally, the first bottom electrode layer and the second bottom electrode layer are subjected to an annealing treatment before the deposition of a subsequent dielectric layer. In some embodiments, the dielectric layer includes doped titanium oxide. Optionally, the dielectric layer is subjected to an annealing treatment before the deposition of a subsequent oxygen-rich metal oxide layer. In some embodiments, the oxygen-rich metal oxide layer includes molybdenum oxide. In some embodiments, the third top electrode layer includes molybdenum oxide. In some embodiments, the fourth top electrode layer includes tantalum nitride. Optionally, the capacitor stack may be subjected to a PMA treatment. In some embodiments, the PMA treatment is performed soon (i.e. before further processing steps) after the forming of the fourth top electrode layer.

In some embodiments, the first bottom electrode layer includes tantalum aluminum nitride and the second bottom electrode layer includes molybdenum oxide. Optionally, the first bottom electrode layer and the second bottom electrode layer are subjected to an annealing treatment before the deposition of a subsequent dielectric layer. In some embodiments, the dielectric layer includes doped titanium oxide. Optionally, the dielectric layer is subjected to an annealing treatment before the deposition of a subsequent oxygen-rich metal oxide layer. In some embodiments, the oxygen-rich metal oxide layer includes molybdenum oxide. In some embodiments, the third top electrode layer includes molybdenum oxide. In some embodiments, the fourth top electrode layer includes tantalum aluminum nitride. Optionally, the capacitor stack may be subjected to a PMA treatment. In some embodiments, the PMA treatment is performed soon (i.e. before further processing steps) after the forming of the fourth top electrode layer.

In some embodiments, the first bottom electrode layer includes tantalum silicon nitride and the second bottom electrode layer includes molybdenum oxide. Optionally, the first bottom electrode layer and the second bottom electrode layer are subjected to an annealing treatment before the deposition of a subsequent dielectric layer. In some embodiments, the dielectric layer includes doped titanium oxide. Optionally, the dielectric layer is subjected to an annealing treatment before the deposition of a subsequent oxygen-rich metal oxide layer. In some embodiments, the oxygen-rich metal oxide layer includes molybdenum oxide. In some embodiments, the third top electrode layer includes molybdenum oxide. In some embodiments, the fourth top electrode layer includes tantalum silicon nitride. Optionally, the capacitor stack may be subjected to a PMA treatment. In some embodiments, the PMA treatment is performed soon (i.e. before further processing steps) after the forming of the fourth top electrode layer.

Titanium nitride has been widely used as both the first bottom electrode layer and the fourth top electrode layer in DRAM devices. However, titanium nitride is sensitive to oxidation. The surface of the titanium nitride layer will react with oxidants to form a titanium oxy-nitride layer. This titanium oxy-nitride layer has high resistivity and poor materials properties, leading to increased leakage current through the device. The titanium nitride can be subject to oxidation when exposed to aggressive oxidants such as ozone during subsequent layer depositions using ALD techniques.

Figure 7:
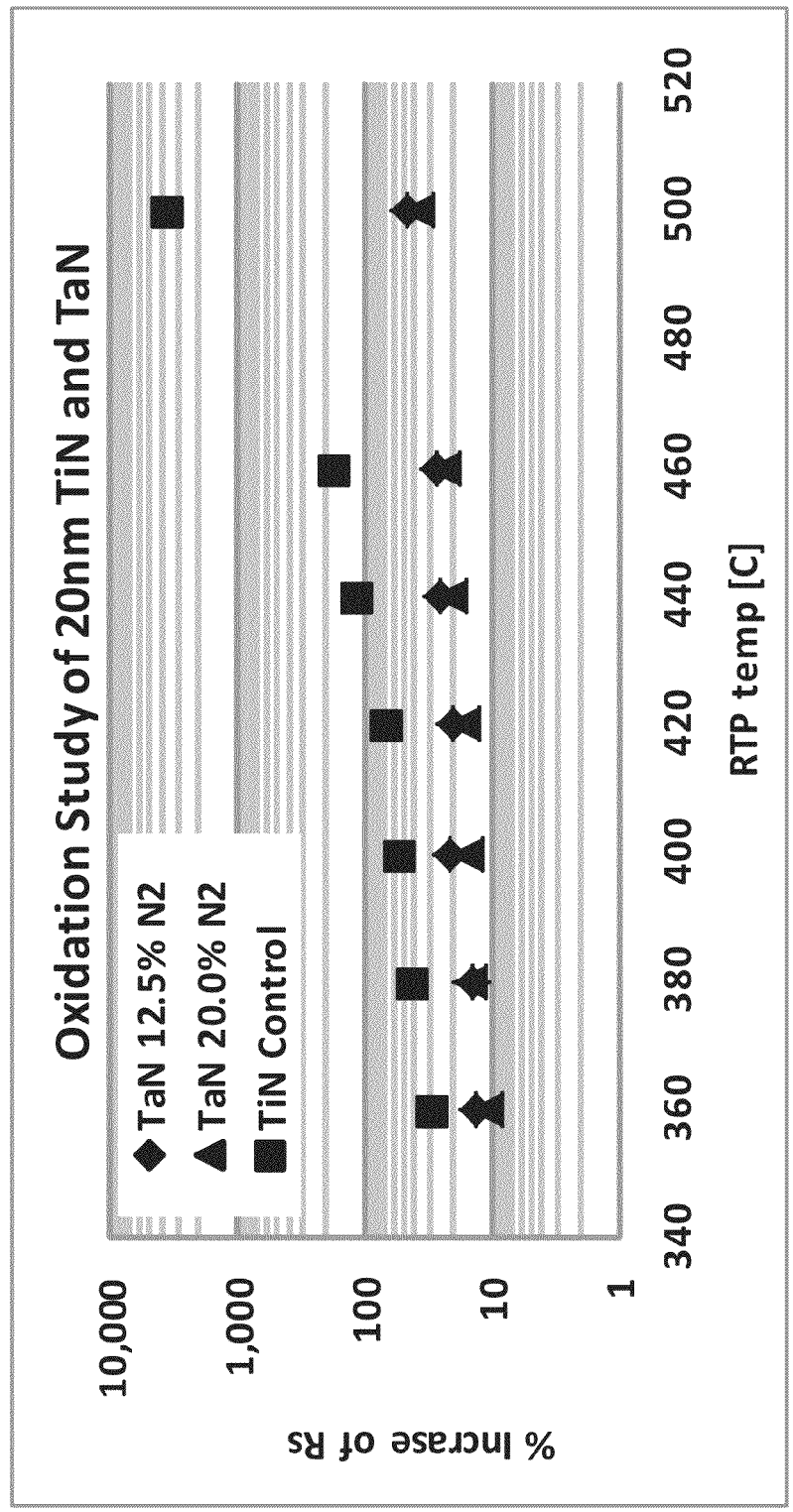
FIG. 7 presents data for the % increase in sheet resistance for several materials according to some embodiments.

Tantalum nitride is a metal nitride candidate to replace titanium nitride in the electrode structures of DRAM devices. Tantalum nitride has a higher resistance to oxidation than titanium nitride. FIG. 7 presents data for the % increase in sheet resistance for several materials according to some embodiments. Sheet resistance is an indicator of oxidation because oxynitrides have higher sheet resistance than the corresponding nitrides. A titanium nitride control group of samples was prepared using reactive sputtering in 100% nitrogen in argon (represented by square data points). The titanium nitride samples each had a thickness of about 20 nm. Two groups of tantalum nitride samples were prepared using reactive sputtering using nitrogen in argon. A first group of tantalum nitride samples were prepared using 12.5% nitrogen in argon (represented by diamond data points). A second group of tantalum nitride samples were prepared using 20.0% nitrogen in argon (represented by triangular data points). The tantalum nitride samples each had a thickness of about 20 nm.

Samples from each group were subjected to a rapid thermal process (RTP) treatment using 4% oxygen in nitrogen at temperatures between 360 C and 500 C. Each RTP treatment was made for 10 minutes. The sheet resistance (Rs) was measured for each sample before and after the RTP treatment. FIG. 7 presents data for the %-increase in the Rs for each of the sample groups as a function of RTP treatment temperature. The sheet resistance of the titanium nitride control samples (represented by square data points) increased by more than 5000% at an RTP treatment temperature of 500 C. In contrast, the sheet resistance of both of the tantalum nitride sample groups (represented by diamond data points and triangular data points) increased by less than 40% at an RTP treatment temperature of 500 C. From this data, it can be concluded that tantalum nitride has a stronger resistance to oxidation than titanium nitride.

One of the benefits of titanium nitride is its ability to promote the $MoO_2$ compound of molybdenum oxide. As discussed previously, $MoO_2$ has a distorted rutile crystal structure and serves as a good template of the high-k rutile phase of titanium oxide. If tantalum nitride is to replace titanium nitride in the electrode structures of DRAM capacitors, it must also promote the $MoO_2$ compound of molybdenum oxide.

Figure 8:
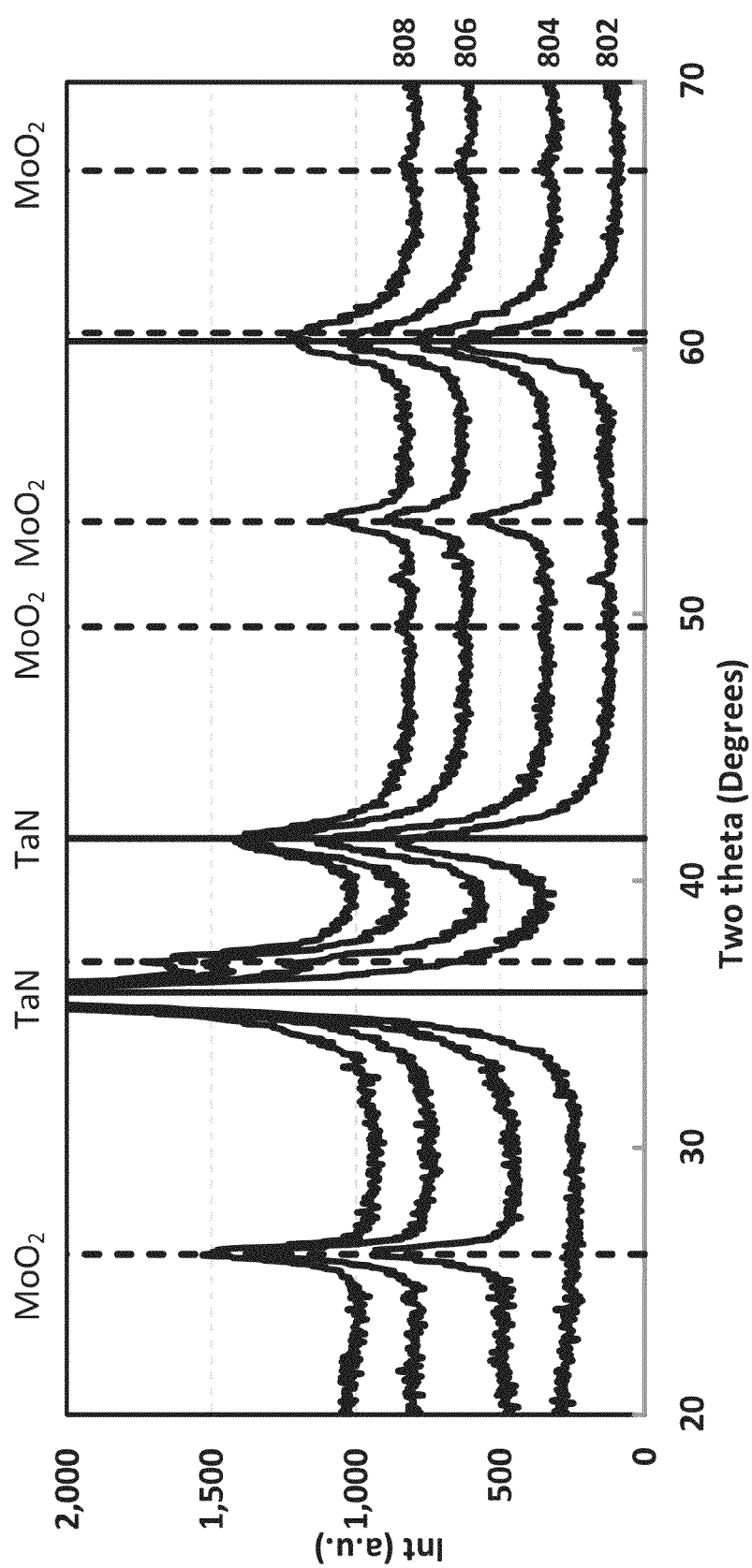
FIG. 8 presents x-ray diffraction (XRD) data for $MoO_x$ materials according to some embodiments.

FIG. 8 presents x-ray diffraction (XRD) data for $MoO_x$ materials according to some embodiments. The spectra present XRD data for 20 nm of molybdenum oxide deposited on 60 nm of tantalum nitride. The tantalum nitride layer was deposited by reactive sputtering using 15.0% nitrogen in argon. The molybdenum oxide was deposited by ALD. The spectrum, 802, presents XRD data for the film stack "as deposited". That is, no subsequent annealing treatments have been performed. The peaks at ~42 degrees 2-theta and ~36 degrees 2-theta correspond to the tantalum nitride layer. There are no peaks at ~26 degrees 2-theta and ~54 degrees 2-theta, indicating that the molybdenum oxide is amorphous in the as-deposited state. The spectrum, 804, presents XRD data for the film stack after annealing the stack for 10 minutes at 400 C in nitrogen. There are peaks at ~26 degrees 2-theta and ~54 degrees 2-theta, indicating that the molybdenum oxide has begun to crystallize to the $MoO_2$ phase after this annealing treatment. The spectrum, 806, presents XRD data for the film stack after annealing the stack for 10 minutes at 450 C in nitrogen. There are peaks at ~26 degrees 2-theta and ~54 degrees 2-theta, indicating that the molybdenum oxide has begun to crystallize to the $MoO_2$ phase after this annealing treatment. The $MoO_2$ peaks are more intense and sharper (e.g. narrower) than the peaks in spectrum 804. This indicates that the molybdenum oxide layer annealed at 450 C has higher crystallinity than the sample annealed at 400 C. The spectrum, 808, presents XRD data for the film stack after annealing the stack for 10 minutes at 500 C in nitrogen. There are peaks at ~26 degrees 2-theta and ~54 degrees 2-theta, indicating that the molybdenum oxide has begun to crystallize to the $MoO_2$ phase after this annealing treatment. The $MoO_2$ peaks are more intense and sharper (e.g. narrower) than the peaks in spectrum 804 or 806. This indicates that the molybdenum oxide layer annealed at 500 C has higher crystallinity than the samples annealed at 400 C or 450 C.

Capacitor stacks were formed to evaluate the electrical performance using tantalum nitride as the first bottom electrode layer. A first bottom electrode layer including 60 nm of tantalum nitride was formed using reactive sputtering in 15% nitrogen. A second bottom electrode layer including 5 nm of molybdenum oxide was formed using ALD on top of the tantalum nitride. The tantalum nitride and the molybdenum oxide were subjected to an anneal at 500 C for 10 minutes in nitrogen to crystallize the molybdenum oxide.

A dielectric layer including 5.2 nm of titanium oxide doped with 15% of Al, calculated as (Al/(Al+Ti)), was formed using ALD on top of the molybdenum oxide. A dielectric layer including 1.2 nm of zirconium oxide was formed using ALD on top of the titanium oxide. The doped titanium oxide layer and the zirconium oxide layer form a dielectric nanolaminate. This nanolaminate will be designated as "TAZ" in the discussion below. The dielectric nanolaminate was subjected to an anneal at 400 C for 10 minutes in dilute oxygen (e.g. less than 10% oxygen).

A top electrode including platinum was deposited using PVD through a shadow mask to form stacked capacitor structures. Current-Voltage (IN), Capacitance-Voltage (CN), and leakage current density (J in units of $A/cm^2$) data were collected in the voltage range between −5V and +5V. Table 1 presents data for two groups of samples using tantalum nitride compared to a control group of samples using titanium nitride. Each sample group represents the average of 18 devices. The data in Table 1 indicate that the use of tantalum nitride in the electrode structures for DRAM capacitors has no negative effects.

TABLE 1

| Bottom Electrode | Dielectric Material | Dielectric Thickness | Top Electrode | J at 1V $(A/cm^2)$ | EOT (nm) | K-value |
| --- | --- | --- | --- | --- | --- | --- |
| TaN/MoO$_2$ | TAZ | 6.4 | Pt | 1.3E-7 | 0.53 | 47.4 |
| TaN/MoO$_2$ | TAZ | 6.4 | Pt | 1.7E-7 | 0.52 | 48.0 |
| TiN/MoO$_2$ | TAZ | 6.4 | Pt | 1.7E-7 | 0.52 | 48.0 |

Figure 9:
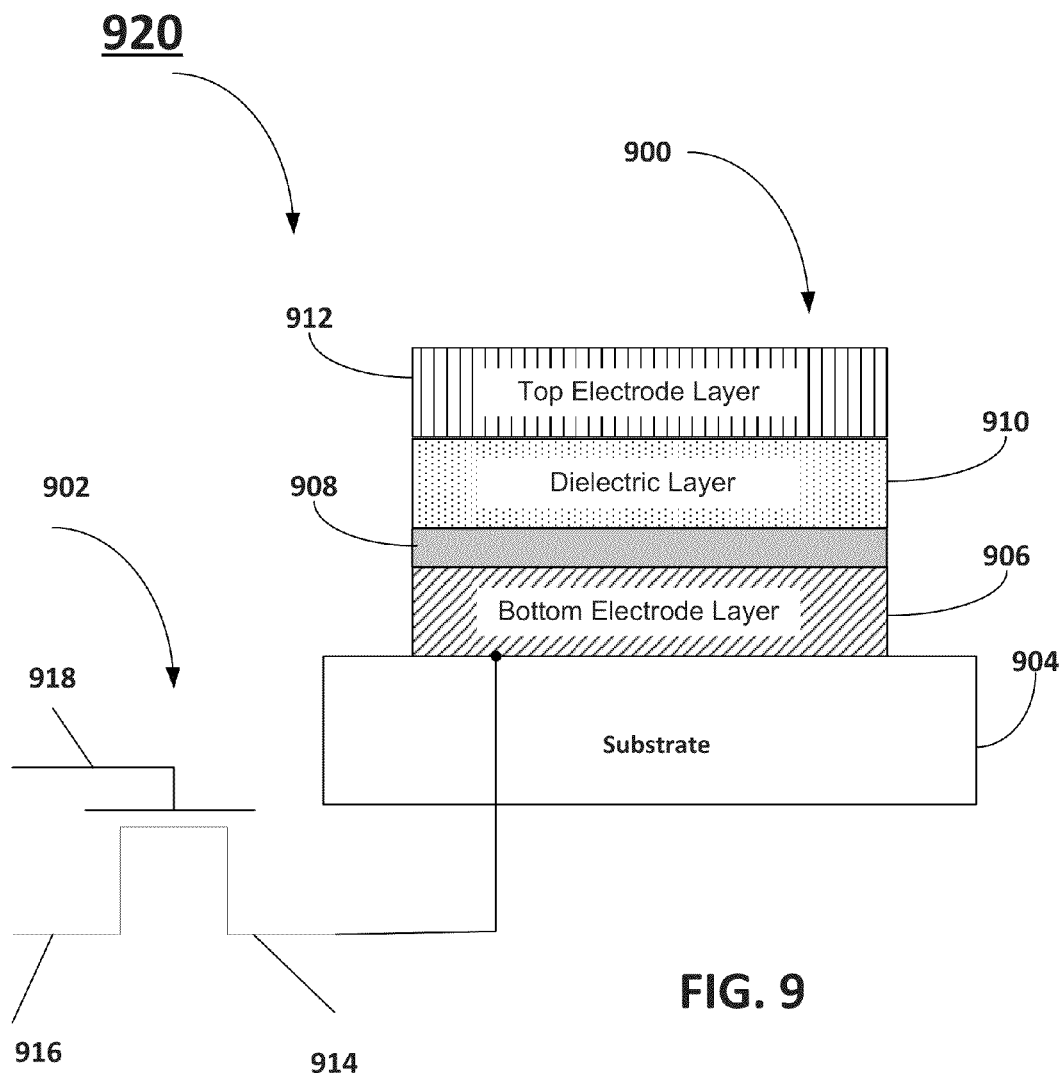
FIG. 9 illustrates a simplified cross-sectional view of a DRAM memory cell fabricated in accordance with some embodiments of the present invention.

An example of a specific application of some embodiments is in the fabrication of capacitors used in the memory cells in DRAM devices. DRAM memory cells effectively use a capacitor to store charge for a period of time, with the charge being electronically "read" to determine whether a logical "one" or "zero" has been stored in the associated cell. Conventionally, a cell transistor is used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to capacitor manufacturing and to DRAM manufacturing. FIG. 9 is used to illustrate one DRAM cell, 920, manufactured using a dielectric structure as discussed previously. The cell, 920, is illustrated schematically to include two principal components, a cell capacitor, 900, and a cell transistor, 902. The cell transistor is usually constituted by a MOS transistor having a gate, 918, source, 914, and drain, 916. The gate is usually connected to a word line and one of the source or drain is connected to a bit line. The cell capacitor has a lower or storage electrode, 906+908, and an upper or plate electrode, 912. The storage electrode is connected to the other of the source or drain and the plate electrode is connected to a reference potential conductor (not shown). The cell transistor is, when selected, turned "on" by an active level of the word line to read or write data from or into the cell capacitor via the bit line.

As was described previously, the cell capacitor, 900, includes a first bottom electrode layer, 906, formed above substrate, 904. The first bottom electrode layer, 906, is connected to the source or drain of the cell transistor, 902. For illustrative purposes, the first bottom electrode has been connected to the source, 914, in this example. First bottom electrode layer, 906, can include one of metals, conductive metal oxides, conductive metal nitrides, conductive metal silicides, and combinations thereof. In some embodiments, the first bottom electrode material is a conductive metal nitride. Examples of suitable conductive metal nitrides include titanium nitride, titanium aluminum nitride, titanium silicon nitride, tantalum nitride, tantalum aluminum nitride, or tantalum silicon nitride, nickel nitride, tungsten nitride, vanadium nitride, molybdenum nitride, and cobalt nitride, or combinations thereof. In some embodiments, the first bottom electrode material is tantalum nitride.

A second bottom electrode layer, 908, is formed above the first bottom electrode layer. Examples of suitable second bottom electrode materials include metals, conductive metal oxides, conductive metal silicides, conductive metal nitrides, and combinations thereof. Two particularly interesting classes of 2 materials are the conductive metal oxides and the conductive metal nitrides. Examples of suitable materials for the second bottom electrode layer include molybdenum oxide, chromium oxide, cobalt oxide, iridium oxide, manganese oxide, nickel oxide, ruthenium oxide, tin oxide, or tungsten oxide. In some embodiments, second bottom electrode layer includes molybdenum oxide. As discussed previously, first bottom electrode layer, 906, and second bottom electrode layer, 908, may be subjected to an anneal before the formation of the dielectric layer if the second bottom electrode layer is a conductive metal oxide (e.g. molybdenum oxide).

Crystalline, doped, high-k dielectric layer, 910, is formed above the second bottom electrode layer. Examples of suitable dielectric materials include aluminum oxide, barium-strontium-titanate (BST), erbium oxide, hafnium oxide, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, or doped versions of the same. These dielectric materials may be formed as a single layer or may be formed as a hybrid or nanolaminate structure. In some embodiments, the dielectric material is titanium oxide. In some embodiments, the dielectric material is doped titanium oxide. Typical dopants for titanium oxide include Al, Ce, Co, Er, Ga, Gd, Ge, Hf, In, La, Lu, Mg, Mn, Nd, Pr, Sc, Si, Sn, Sr, Y, Zr, or combinations thereof. Typically, the first bottom electrode layer, the second bottom electrode layer, and the high-k dielectric layer are then subjected to a PDA treatment. The fourth top electrode layer, 912, is then formed above the dielectric layer. The fourth top electrode layer can include at least one of metals, conductive metal oxides, conductive metal nitrides, conductive metal silicides, conductive metal carbides, and combinations thereof. Examples of suitable conductive metal nitrides include titanium nitride, titanium aluminum nitride, titanium silicon nitride, tantalum nitride, tantalum aluminum nitride, or tantalum silicon nitride, nickel nitride, tungsten nitride, vanadium nitride, molybdenum nitride, and cobalt nitride, or combinations thereof. This completes the formation of the capacitor stack. Typically, the capacitor stack is then subjected to a PMA treatment. In some embodiments, the PMA treatment is performed soon (i.e. before further processing steps) after the forming of the fourth top electrode layer.

In some embodiments, first bottom electrode layer, 906, includes tantalum nitride, second bottom electrode layer, 908, includes molybdenum oxide, dielectric layer, 910, includes a nanolaminate of aluminum-doped titanium oxide and zirconium oxide, and fourth top electrode layer, 912, includes titanium nitride.

Figure 10:
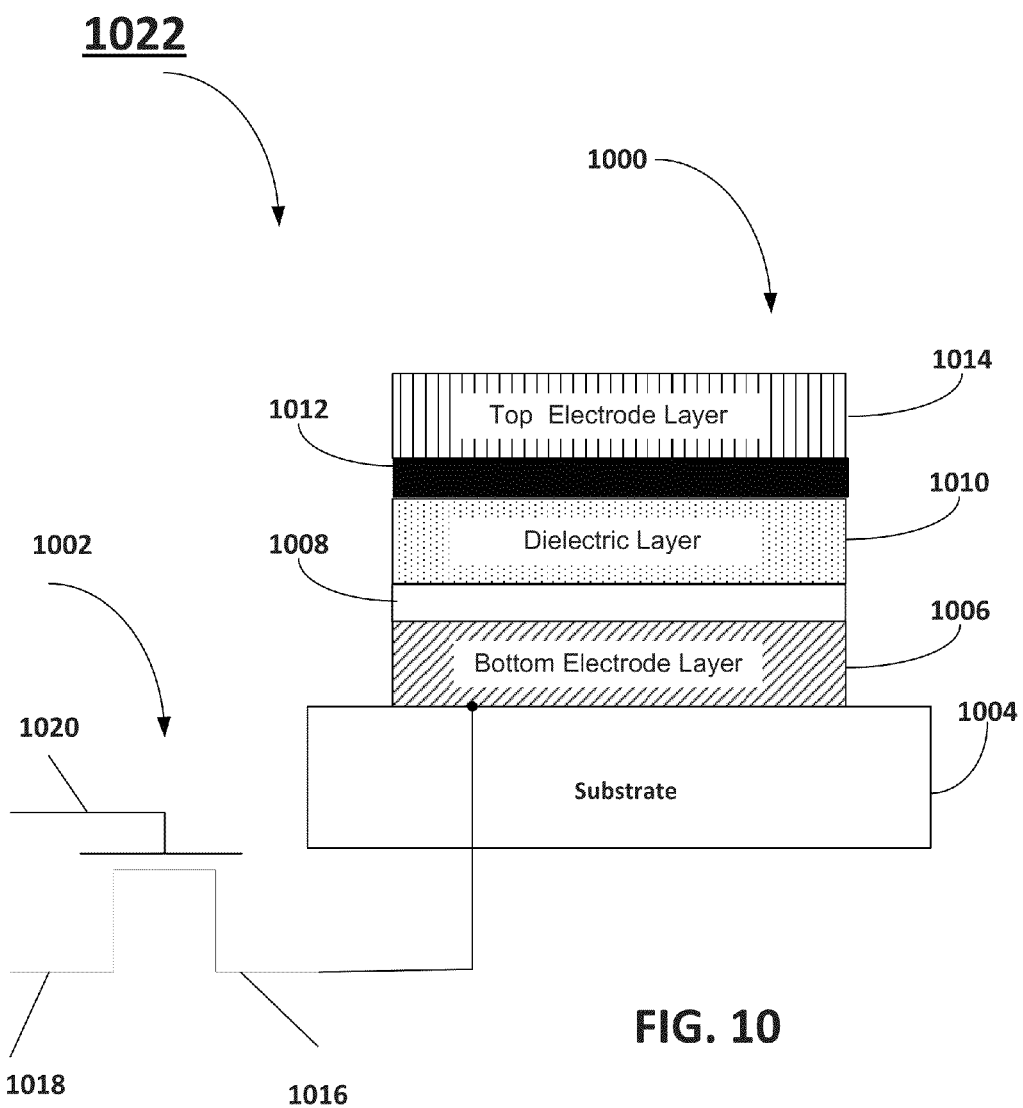
FIG. 10 illustrates a simplified cross-sectional view of a DRAM memory cell fabricated in accordance with some embodiments of the present invention.

An example of a specific application of some embodiments is in the fabrication of capacitors used in the memory cells in DRAM devices. DRAM memory cells effectively use a capacitor to store charge for a period of time, with the charge being electronically "read" to determine whether a logical "one" or "zero" has been stored in the associated cell. Conventionally, a cell transistor is used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to capacitor manufacturing and to DRAM manufacturing. FIG. 10 is used to illustrate one DRAM cell, 1022, manufactured using a dielectric structure as discussed previously. The cell, 1022, is illustrated schematically to include two principal components, a cell capacitor, 1000, and a cell transistor, 1002. The cell transistor is usually constituted by a MOS transistor having a gate, 1020, source, 1016, and drain, 1018. The gate is usually connected to a word line and one of the source or drain is connected to a bit line. The cell capacitor has a lower or storage electrode, 1006+1008, and an upper or plate electrode, 1014. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously, the cell capacitor, 1000, includes a first bottom electrode layer, 1006, formed above substrate, 1004. The first bottom electrode layer, 1006, is connected to the source or drain of the cell transistor, 1002. For illustrative purposes, the first bottom electrode has been connected to the source, 1016, in this example. First bottom electrode layer, 1006, can include one of metals, conductive metal oxides, conductive metal nitrides, conductive metal silicides, and combinations thereof. In some embodiments, the first bottom electrode material is a conductive metal nitride. Examples of suitable conductive metal nitrides include titanium nitride, titanium aluminum nitride, titanium silicon nitride, tantalum nitride, tantalum aluminum nitride, or tantalum silicon nitride, nickel nitride, tungsten nitride, vanadium nitride, molybdenum nitride, and cobalt nitride, or combinations thereof. In some embodiments, the first bottom electrode material is tantalum nitride.

A second bottom electrode layer, 1008, is formed above the first bottom electrode layer. Examples of suitable second bottom electrode materials include metals, conductive metal oxides, conductive metal silicides, conductive metal nitrides, and combinations thereof. Two particularly interesting classes of materials are the conductive metal oxides and the conductive metal nitrides. Examples of suitable materials for the second bottom electrode layer include molybdenum oxide, chromium oxide, cobalt oxide, iridium oxide, manganese oxide, nickel oxide, ruthenium oxide, tin oxide, or tungsten oxide. In some embodiments, second bottom electrode layer includes molybdenum oxide. As discussed previously, first bottom electrode layer, 1006, and second bottom electrode layer, 1008, may be subjected to an anneal before the formation of the dielectric layer if the second bottom electrode layer is a conductive metal oxide (e.g. molybdenum oxide).

Crystalline, doped, high-k dielectric layer, 1010, is formed above the second bottom electrode layer. Examples of suitable dielectric materials include aluminum oxide, barium-strontium-titanate (BST), erbium oxide, hafnium oxide, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, or doped versions of the same. These dielectric materials may be formed as a single layer or may be formed as a hybrid or nanolaminate structure. In some embodiments, the dielectric material is titanium oxide. In some embodiments, the dielectric material is doped titanium oxide. Typical dopants for titanium oxide include Al, Ce, Co, Er, Ga, Gd, Ge, Hf, In, La, Lu, Mg, Mn, Nd, Pr, Sc, Si, Sn, Sr, Y, Zr, or combinations thereof. Typically, the first bottom electrode layer, the second bottom electrode layer, and the high-k dielectric layer are then subjected to a PDA treatment.

Oxygen-rich metal oxide layer, 1012, is then formed above the dielectric layer, 1010. The oxygen-rich metal oxide layer can serve as a source of oxygen to ensure that the concentration of oxygen vacancies in the dielectric layer does not increase during subsequent heat treatments.

The fourth top electrode layer, 1014, is then formed above the oxygen-rich metal oxide layer, 1012. The fourth top electrode layer can include at least one of metals, conductive metal oxides, conductive metal nitrides, conductive metal silicides, conductive metal carbides, and combinations thereof. Examples of suitable conductive metal nitrides include titanium nitride, titanium aluminum nitride, titanium silicon nitride, tantalum nitride, tantalum aluminum nitride, or tantalum silicon nitride, nickel nitride, tungsten nitride, vanadium nitride, molybdenum nitride, and cobalt nitride, or combinations thereof. This completes the formation of the capacitor stack. Typically, the capacitor stack is then subjected to a PMA treatment. In some embodiments, the PMA treatment is performed soon (i.e. before further processing steps) after the forming of the fourth top electrode layer.

In some embodiments, first bottom electrode layer, 1006, includes tantalum nitride, second bottom electrode layer, 1008, includes molybdenum oxide, dielectric layer, 1010, includes a nanolaminate of aluminum-doped titanium oxide and zirconium oxide, oxygen-rich metal oxide layer, 1012, includes oxygen-rich molybdenum oxide, and fourth top electrode layer, 1014, includes titanium nitride.

Figure 11:
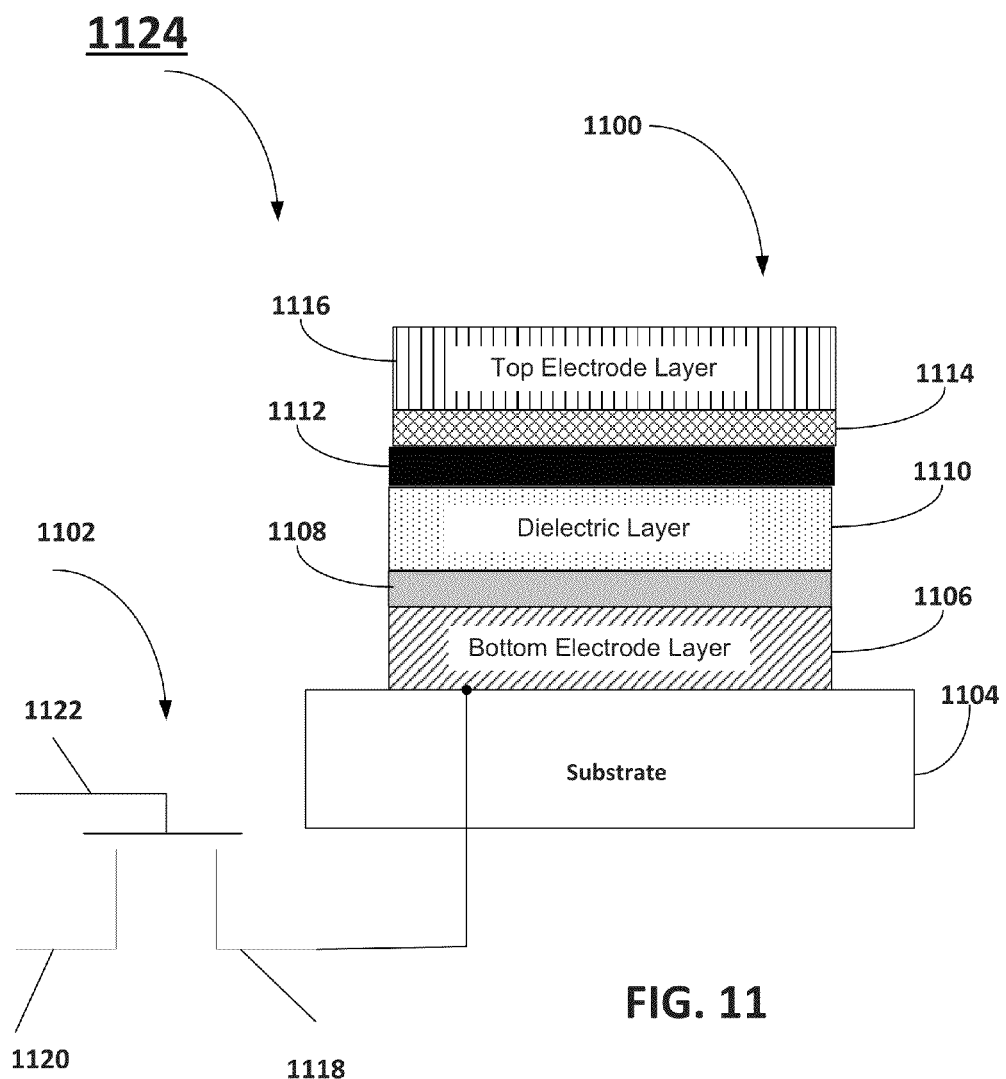
FIG. 11 illustrates a simplified cross-sectional view of a DRAM memory cell fabricated in accordance with some embodiments of the present invention.

An example of a specific application of some embodiments is in the fabrication of capacitors used in the memory cells in DRAM devices. DRAM memory cells effectively use a capacitor to store charge for a period of time, with the charge being electronically "read" to determine whether a logical "one" or "zero" has been stored in the associated cell. Conventionally, a cell transistor is used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to capacitor manufacturing and to DRAM manufacturing. FIG. 11 is used to illustrate one DRAM cell, 1124, manufactured using a dielectric structure as discussed previously. The cell, 1124, is illustrated schematically to include two principal components, a cell capacitor, 1100, and a cell transistor, 1102. The cell transistor is usually constituted by a MOS transistor having a gate, 1122, source, 1118, and drain, 1120. The gate is usually connected to a word line and one of the source or drain is connected to a bit line. The cell capacitor has a lower or storage electrode, 1106+1108, and an upper or plate electrode, 1116. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously, the cell capacitor, 1100, includes a first bottom electrode layer, 1106, formed above substrate, 1104. The first bottom electrode layer, 1106, is connected to the source or drain of the cell transistor, 1102. For illustrative purposes, the first bottom electrode has been connected to the source, 1118, in this example. First bottom electrode layer, 1106, can include one of metals, conductive metal oxides, conductive metal nitrides, conductive metal silicides, and combinations thereof. In some embodiments, the first bottom electrode material is a conductive metal nitride. Examples of suitable conductive metal nitrides include titanium nitride, titanium aluminum nitride, titanium silicon nitride, tantalum nitride, tantalum aluminum nitride, or tantalum silicon nitride, nickel nitride, tungsten nitride, vanadium nitride, molybdenum nitride, and cobalt nitride, or combinations thereof. In some embodiments, the first bottom electrode material is tantalum nitride.

A second bottom electrode layer, 1108, is formed above the first bottom electrode layer. Examples of suitable second bottom electrode materials include metals, conductive metal oxides, conductive metal silicides, conductive metal nitrides, and combinations thereof. Two particularly interesting classes of materials are the conductive metal oxides and the conductive metal nitrides. Examples of suitable materials for the second bottom electrode layer include molybdenum oxide, chromium oxide, cobalt oxide, iridium oxide, manganese oxide, nickel oxide, ruthenium oxide, tin oxide, or tungsten oxide. In some embodiments, second bottom electrode layer includes molybdenum oxide. As discussed previously, first bottom electrode layer, 1106, and second bottom electrode layer, 1108, may be subjected to an anneal before the formation of the dielectric layer if the second bottom electrode layer is a conductive metal oxide (e.g. molybdenum oxide).

Crystalline, doped, high-k dielectric layer, 1110, is formed above the second bottom electrode layer. Examples of suitable dielectric materials include aluminum oxide, barium-strontium-titanate (BST), erbium oxide, hafnium oxide, lanthanum oxide, niobium oxide, lead-zirconium-titanate (PZT), a bilayer of silicon oxide and silicon nitride, silicon oxy-nitride, strontium titanate (STO), tantalum oxide, titanium oxide, zirconium oxide, or doped versions of the same. These dielectric materials may be formed as a single layer or may be formed as a hybrid or nanolaminate structure. In some embodiments, the dielectric material is titanium oxide. In some embodiments, the dielectric material is doped titanium oxide. Typical dopants for titanium oxide include Al, Ce, Co, Er, Ga, Gd, Ge, Hf, In, La, Lu, Mg, Mn, Nd, Pr, Sc, Si, Sn, Sr, Y, Zr, or combinations thereof. Typically, the first bottom electrode layer, the second bottom electrode layer, and the high-k dielectric layer are then subjected to a PDA treatment.

Oxygen-rich metal oxide layer, 1112, is then formed above the dielectric layer, 1110. The oxygen-rich metal oxide layer can serve as a source of oxygen to ensure that the concentration of oxygen vacancies in the dielectric layer does not increase during subsequent heat treatments.

In the next step, third top electrode layer 1114, would then be formed above the oxygen-rich metal oxide layer, 1112, wherein the third top electrode layer comprises a metal element. Examples of suitable electrode materials include metals, conductive metal oxides, conductive metal silicides, conductive metal nitrides, and combinations thereof. Two particularly interesting classes of materials are the conductive metal oxides and the conductive metal nitrides. Examples of suitable materials for the third top electrode layer include molybdenum oxide, chromium oxide, cobalt oxide, iridium oxide, manganese oxide, nickel oxide, ruthenium oxide, tin oxide, or tungsten oxide.

The fourth top electrode layer, 1116, is then formed above the third top electrode layer, 1114. The fourth top electrode layer can include at least one of metals, conductive metal oxides, conductive metal nitrides, conductive metal silicides, conductive metal carbides, and combinations thereof. Examples of suitable conductive metal nitrides include titanium nitride, titanium aluminum nitride, titanium silicon nitride, tantalum nitride, tantalum aluminum nitride, or tantalum silicon nitride, nickel nitride, tungsten nitride, vanadium nitride, molybdenum nitride, and cobalt nitride, or combinations thereof. This completes the formation of the capacitor stack. Typically, the capacitor stack is then subjected to a PMA treatment. In some embodiments, the PMA treatment is performed soon (i.e. before further processing steps) after the forming of the fourth top electrode layer.

In some embodiments, first bottom electrode layer, 1106, includes tantalum nitride, second bottom electrode layer, 1108, includes molybdenum oxide, dielectric layer, 1110, includes a nanolaminate of aluminum-doped titanium oxide and zirconium oxide, oxygen-rich metal oxide layer, 1112, includes oxygen-rich molybdenum oxide, third top electrode layer, 1114, includes molybdenum oxide, and fourth top electrode layer, 1116, includes titanium nitride.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming a capacitor stack, the method comprising:
    forming a first bottom electrode layer above a surface of a substrate, wherein the first bottom electrode layer comprises a conductive metal nitride material;
    forming a second bottom electrode layer above the first bottom electrode layer, wherein the second bottom electrode layer comprises a conductive metal oxide material;
    forming a dielectric layer above the second bottom electrode layer;
    forming an oxygen-rich metal oxide layer above the dielectric layer; and
    forming a top electrode layer above the oxygen-rich metal oxide layer, wherein the top electrode layer comprises a conductive metal nitride material.

2. The method of claim 1, wherein the first bottom electrode layer and the top electrode layer each comprises one of titanium nitride, titanium aluminum nitride, titanium silicon nitride, tantalum nitride, tantalum aluminum nitride, or tantalum silicon nitride.

3. The method of claim 1, wherein the second bottom electrode layer comprises one of molybdenum oxide, chromium oxide, cobalt oxide, iridium oxide, manganese oxide, nickel oxide, ruthenium oxide, tin oxide, or tungsten oxide.

4. The method of claim 1, wherein the second bottom electrode layer comprises molybdenum oxide.

5. The method of claim 1, further comprising an anneal treatment after forming the second bottom electrode layer above the first bottom electrode layer and before forming the dielectric layer above the second bottom electrode layer.

6. The method of claim 1, wherein the dielectric layer comprises titanium oxide.

7. The method of claim 6, wherein the dielectric layer comprises titanium oxide and the dielectric layer further comprises a dopant.

8. The method of claim 7, wherein the dopant comprises aluminum.

9. The method of claim 1, further comprising an anneal treatment after forming the dielectric layer above the second bottom electrode layer and before forming the oxygen-rich metal oxide layer above the dielectric layer.

10. The method of claim 1, wherein the oxygen-rich metal oxide layer comprises molybdenum oxide.

11. The method of claim 1, wherein forming the top electrode layer comprises:
   forming a first top electrode layer above the oxygen-rich metal oxide layer; and
   forming a second top electrode layer above the first top electrode layer.

12. The method of claim 11, wherein the first top electrode layer comprises a metal oxide material and the second top electrode layer comprises a conductive metal nitride material.

13. The method of claim 12, wherein the second top electrode layer comprises one of titanium nitride, titanium aluminum nitride, titanium silicon nitride, tantalum nitride, tantalum aluminum nitride, or tantalum silicon nitride.

14. The method of claim 11, wherein the first top electrode layer comprises molybdenum oxide.

15. The method of claim 5, wherein the anneal treatment after forming the second bottom electrode layer is performed in one of an inert or a reducing atmosphere for between about 1 millsecond and about 60 minutes.

16. The method of claim 9, wherein the anneal treatment after forming the dielectric layer is performed in an oxidizing atmosphere between about 400 C and about 600 C for between about 1 millsecond and about 60 minutes.

17. The method of claim 1, further comprising performing an anneal treatment after forming the top electrode layer.

18. The method of claim 17, wherein the anneal treatment after forming the top electrode layer is performed soon after forming the top electrode layer.

19. A method for forming a capacitor stack, the method comprising:
   forming a first bottom electrode layer above a surface of a substrate, wherein the first bottom electrode layer comprises a conductive metal nitride material;
   forming a second bottom electrode layer above the first bottom electrode layer, wherein the second bottom electrode layer comprises a conductive metal oxide material;
   annealing the first and second bottom electrode layers;
   forming a dielectric layer above the second bottom electrode layer, wherein the dielectric layer comprises a metal oxide material;
   annealing the dielectric layer;
   forming an oxygen-rich metal oxide layer above the dielectric layer;
   forming a top electrode layer above the oxygen-rich metal oxide layer, wherein the top electrode layer comprises a conductive metal nitride material; and
   annealing the oxygen-rich metal oxide layer so that at least a portion of the oxygen-rich metal oxide layer is converted to a stoichiometric metal oxide compound.

20. The method of claim 19, wherein the first bottom electrode layer comprises titanium nitride, the second bottom electrode layer comprises molybdenum oxide, the dielectric layer comprises titanium oxide, the oxygen-rich metal oxide layer comprises molybdenum oxide, and the top electrode layer comprises titanium nitride.

* * * * *